(12) United States Patent
Sugawara et al.

(10) Patent No.: US 8,199,036 B2
(45) Date of Patent: Jun. 12, 2012

(54) PARALLEL-SERIAL CONVERTER

(75) Inventors: Mariko Sugawara, Kawasaki (JP); Yukito Tsunoda, Kawasaki (JP); Tetsuji Yamabana, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 24 days.

(21) Appl. No.: 12/783,951

(22) Filed: May 20, 2010

(65) Prior Publication Data

US 2010/0302081 A1   Dec. 2, 2010

(30) Foreign Application Priority Data

May 27, 2009   (JP) ................................. 2009-128047

(51) Int. Cl.
*H03M 9/00* (2006.01)
(52) U.S. Cl. ........................................ 341/101; 341/100
(58) Field of Classification Search .................. 341/100, 341/101; 375/175
See application file for complete search history.

(56) References Cited

U.S. PATENT DOCUMENTS

| | | | |
|---|---|---|---|
| 5,778,214 A | 7/1998 | Taya et al. | |
| 6,335,696 B1 * | 1/2002 | Aoyagi et al. | 341/100 |
| 6,731,142 B1 * | 5/2004 | Wang et al. | 327/115 |
| 7,103,110 B2 * | 9/2006 | Cohen et al. | 375/295 |
| 7,525,458 B2 * | 4/2009 | Morzano et al. | 341/100 |
| 2007/0176658 A1 | 8/2007 | Ishikawa | |

FOREIGN PATENT DOCUMENTS

| | | |
|---|---|---|
| JP | 8-163117 A | 6/1996 |
| JP | 2000-196462 A | 7/2000 |
| JP | 2002-204448 A | 7/2002 |
| JP | 2007-202033 A | 8/2007 |

OTHER PUBLICATIONS

Kouichi Kanda, et al., "A Single-40Gb/s Dual-20Gb/s Serializer IC with SFI-5.2 interface in 65nm CMOS", Solid-State Circuits Conference-Digest of Technical Papers, 2009 IEEE International Solid-State Circuits Conference; Feb. 2009, pp. 060-061, 361a.
Japanese Office Action mailed Jan. 31, 2012 for corresponding Japanese Application No. 2009-128047, with partial English-language translation.

* cited by examiner

*Primary Examiner* — Brian Young
(74) *Attorney, Agent, or Firm* — Fujitsu Patent Center

(57) ABSTRACT

There is provided a parallel-serial converter including a selector to convert parallel data to serial data, a flip-flop to which the serial data are input so as to latch the serial data, a generator to generate replica data simulating the serial data, a detector to detect a first switching point of the replica data and a second switching point subsequent to the first switching point, and a controller to control relative timings of timing converted to the serial data in the selector and timing when the serial data is latched in the flip-flop, based on the first switching point and the second switching point.

14 Claims, 26 Drawing Sheets

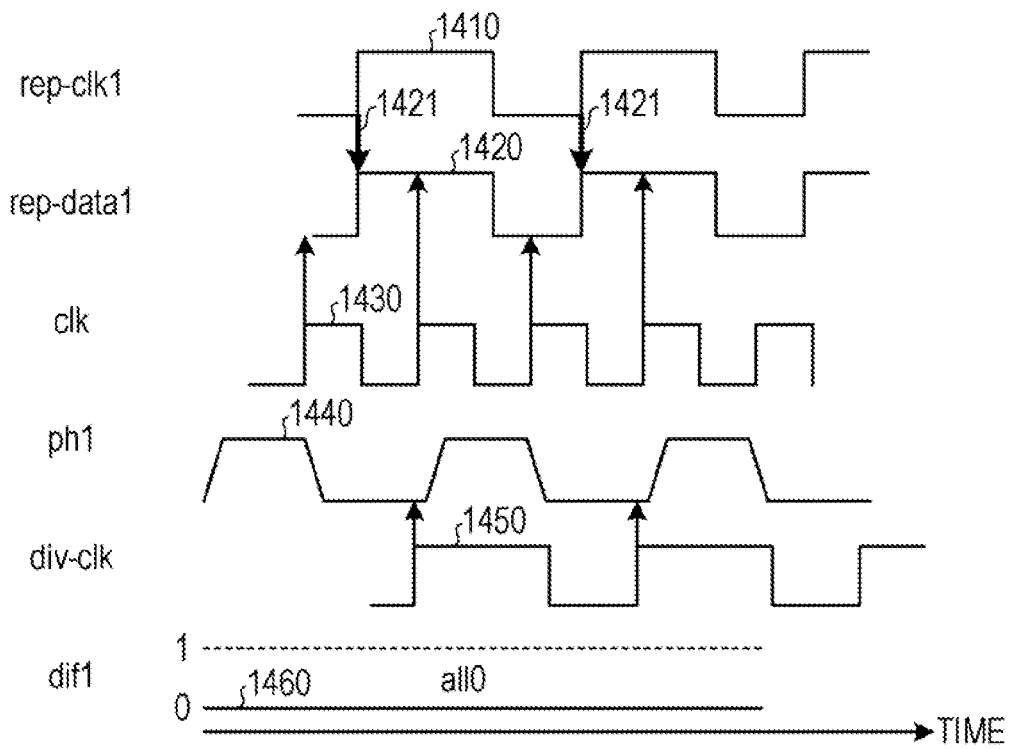
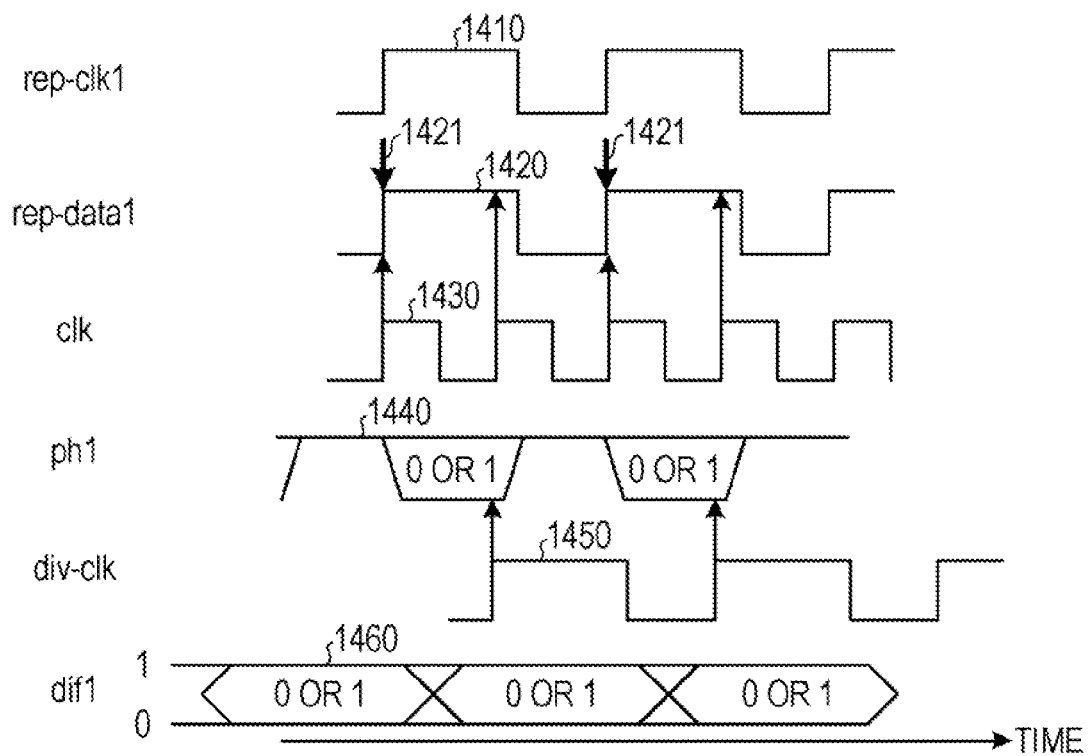

PARALLEL-SERIAL CONVERTER

CROSS-REFERENCE TO RELATED APPLICATION

This application is based upon and claims the benefit of priority of the prior Japanese Patent Application No. 2009-128047, filed on May 27, 2009, the entire contents of which are incorporated herein by reference.

FIELD

The embodiments discussed herein are related to a parallel-serial converter for converting parallel data to serial data.

BACKGROUND

With the recent increase in signal transmission speed, there has been less margin for timing variation in the operating speed of an internal circuit such as a signal receiving device. For example, a flip-flop circuit (flip-flop) is required to provide the setup time and the hold time between an input clock signal and data in order to realize a normal operation. Semiconductor micro-fabrication techniques allow the speed of semiconductor devices to be increased whereas the miniaturization of circuits relatively increases their variation.

Thus, problems occur in that the setup time and the hold time of the flip-flop are reduced with an increase in the fluctuations in the data and clock timing, thus making it difficult to increase the operating speed. One method for converting digital parallel data to serial data (parallel-serial conversion) is to combine 2-bit data using a selector (or a multiplexer) to produce 1-bit data having a double data rate (see, for example, Japanese Laid-open Patent Publications No. 2000-196462, No. 8-163117, No. 2007-202033, and No. 2002-204448).

In order to shape serial data output from a selector using a flip-flop, a clock signal for the flip-flop has a timing which is, for example, delayed by half a phase with respect to the serial data. In order to perform adjustment of the timing, an existing method for adjusting the circuit delay of the clock signal using, for example, a buffer or the like has been proposed.

In the related art described above, however, a delay caused in a buffer, a selector, or the like may change depending on conditions such as process conditions, temperature conditions, or power supply conditions. Thus, a problem occurs in that it is difficult to accurately shape serial data. Furthermore, when the duty ratio of serial data output from the selector is not 50%, another problem occurs in that it is difficult to optimally adjust the timings of the clock signal and the serial data of the flip-flop.

SUMMARY

According to an aspect of the embodiment, there is provided a parallel-serial converter including a selector to convert parallel data to serial data, a flip-flop to which the serial data are input so as to latch the serial data, a generator to generate replica data simulating the serial data, a detector to detect a first switching point of the replica data and a second switching point subsequent to the first switching point, and a controller to control relative timings of timing converted to the serial data in the selector and timing when the serial data is latched in the flip-flop, based on the first switching point and the second switching point.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 14A to FIG. 14C are time charts of the operation of a first detector illustrated in FIG. 13;

DESCRIPTION OF EMBODIMENTS

A parallel-serial converter according to exemplary embodiments will now be described in detail with reference to the accompanying drawings.

First Embodiment

Figure 1:
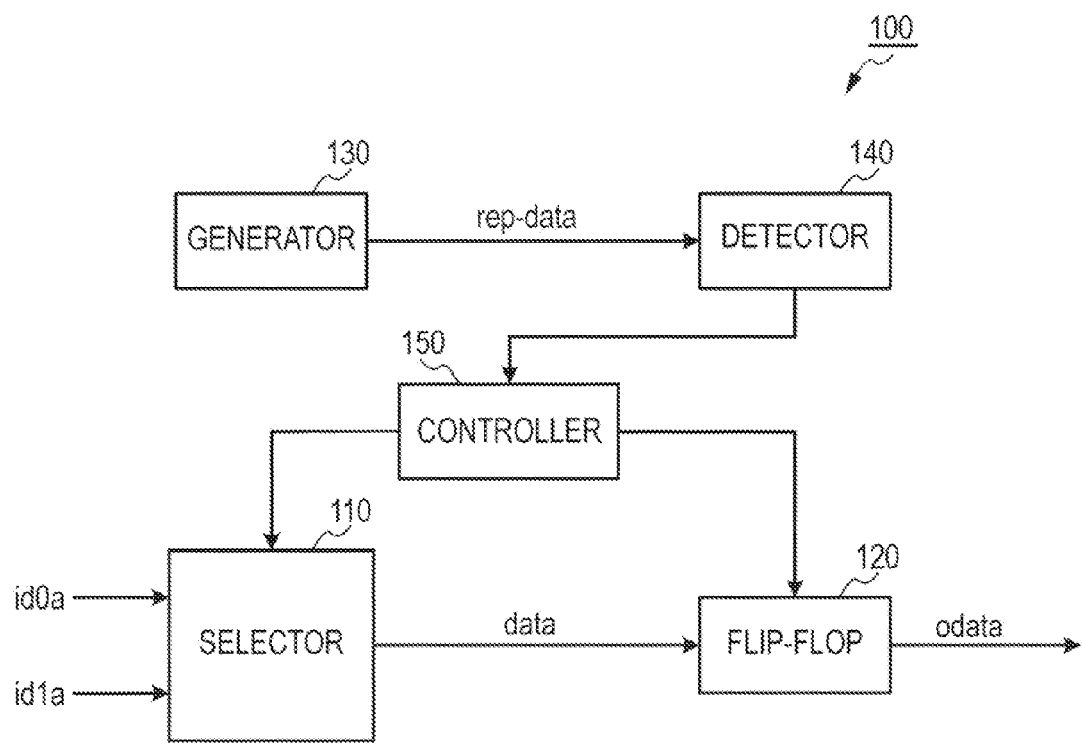
FIG. 1 is a diagram illustrating a parallel-serial converter according to a first embodiment.

FIG. 1 is a diagram illustrating a parallel-serial converter according to a first embodiment. As illustrated in FIG. 1, a parallel-serial converter 100 according to the first embodiment includes a selector (conversion circuit) 110, a flip-flop (flip-flop circuit) 120, a generator (generation circuit) 130, a detector (detection circuit) 140, and a controller (control circuit) 150. The parallel-serial converter 100 may be a parallel-serial converter configured to convert input parallel data "id0a" and "id1a" to serial data "odata" having a data rate that is twice that of the parallel data.

The selector 110 converts the data "id0a" and the data "id1a" from parallel data to serial data. For example, the selector 110 switches between data inputs in synchronization with a first clock signal supplied thereto. Specifically, the selector 110 outputs the data "id0a" in synchronization with a rising edge of the first clock signal, and outputs the data "id1a" in synchronization with a falling edge of the first clock signal. The output of the selector 110 is input to the flip-flop 120 as data "data".

The flip-flop 120 shapes the data "data" output from the selector 110. For example, the flip-flop 120 shapes the data "data" in synchronization with a rising edge of a second clock signal supplied thereto. The output of the flip-flop 120 is output to the subsequent stage as data "odata". The flip-flop 120 shapes and outputs the data "data" as the data "odata".

The generator 130 generates replica data "rep-data" of the data "data" output from the selector 110, and outputs the generated replica data "rep-data" to the detector 140. The replica data "rep-data" of the data "data" may be serial data in which first data and second data are alternately repeated, like, for example, the data "data" in which the data "id0a" and the data "id1a" are alternately repeated.

The detector 140 detects a first switching point of the replica data "rep-data" output from the generator 130 and a second switching point subsequent to the first switching point. The first switching point is, for example, a point at which the replica data "rep-data" switches from the first data to the second data. The second switching point is a point at which the replica data "rep-data" switches from the second data to the first data. The detector 140 notifies the controller 150 of the detected first and second switching points.

The controller 150 controls the relative timings of the serial data output from the selector 110 and the flip-flop 120 on the basis of the first and second switching points notified by the detector 140. The timing of the serial data may be, for example, the timing of switching between the data "id0a" and the data "id1a".

The timing of the flip-flop 120 may be the timing at which the flip-flop 120 outputs the data "data". For example, the controller 150 controls the relative phases of the first clock signal supplied to the selector 110 and the second clock signal supplied to the flip-flop 120. Thus, the timing of the flip-flop 120 relative to the switching timing of the selector 110 is controlled.

Accordingly, the parallel-serial converter 100 according to the first embodiment controls the timing of the flip-flop 120 relative to the switching timing of the selector 110 on the basis of the switching points of the replica data "rep-data" simulating the data "data". Therefore, the timing of the flip-flop 120 relative to the switching timing of the selector 110 may be controlled as desired, and the serial data "data" may be accurately shaped.

The parallel-serial converter 100 further detects the first and second switching points of the replica data "rep-data", and controls the respective timings on the basis of the detected switching points. Thus, even when the duty ratio of the serial data "data" is not 50%, the serial data may be accurately shaped.

Second Embodiment

Figure 2:
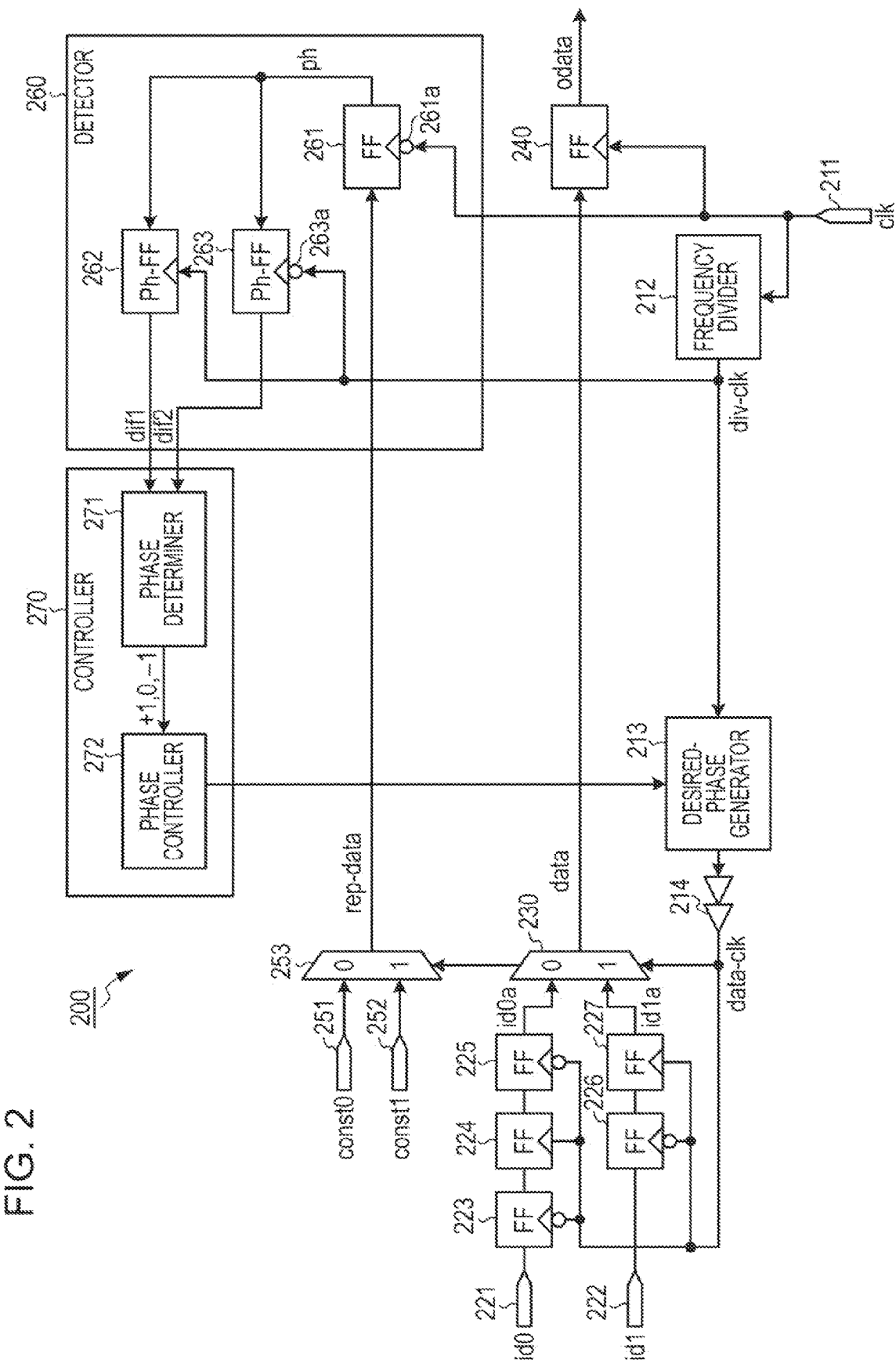
FIG. 2 is a diagram illustrating a parallel-serial converter according to a second embodiment.

FIG. 2 is a diagram illustrating a parallel-serial converter according to a second embodiment. As illustrated in FIG. 2, a parallel-serial converter 200 according to the second embodiment includes an input terminal 211, a frequency divider 212, a desired-phase generator 213, a buffer 214, input terminals 221 and 222, flip-flops (FF) 223 to 227, a selector 230, a flip-flop (FF) 240, input terminals 251 and 252, a selector 253, a detector 260, and a controller 270.

The parallel-serial converter 200 converts data "id0" supplied from the input terminal 221 and data "id1" supplied from the input terminal 222 to data "odata" having a data rate that is twice that of the data "id0" and the data "id1". The data "odata" is supplied to, for example, a receiver (not illustrated). Thus, a data receiving system is configured to include the parallel-serial converter 200 and the receiver.

A clock signal "clk" is input to the input terminal 211. The clock signal "clk" input through the input terminal 211 is input to the frequency divider 212, the flip-flop 240, and the detector 260. The frequency divider 212 divides the frequency of the clock signal "clk" output from the input terminal 211 in half to generate a frequency-divided clock signal "div-clk". The frequency divider 212 outputs the generated frequency-divided clock signal "div-clk" to the desired-phase generator 213 and the detector 260.

The desired-phase generator 213 may be a phase interpolation circuit configured to generate a frequency-divided clock signal having a desired phase from the multiphase frequency-divided clock signal "div-clk" having different phases output from the frequency divider 212. The desired-phase generator 213 changes the phase of the frequency-divided clock signal to be generated under the control of the controller 270. The desired-phase generator 213 outputs the generated frequency-divided clock signal to the buffer 214 as a clock signal "data-clk".

The buffer 214 amplifies the clock signal "data-clk" output from the desired-phase generator 213 to obtain a sufficient driving force to facilitate supply to a large number of elements. The buffer 214 outputs the amplified clock signal "data-clk" to the selector 230 and the flip-flops 223 to 227.

The data "id0" is input to the input terminal 221. The input data "id0" input through the input terminal 221 is input to the flip-flop 223. The data "id0" input to the flip-flop 223 is sequentially latched by the flip-flops 223 to 225 on the basis of the clock signal "data-clk". The data "id0" sequentially latched by the flip-flops 223 to 225 is delayed by one period of the clock signal "data-clk", and is output to the selector 230 as data "id0a".

The data "id1" is input to the input terminal 222. The input data "id1" input through the input terminal 222 is input to the flip-flop 226. The data "id1" input to the flip-flop 226 is sequentially latched by the flip-flops 226 and 227 on the basis of the clock signal "data-clk". The data "id1" sequentially latched by the flip-flops 226 and 227 is delayed by half a period of the clock signal "data-clk", and is output to the selector 230 as data "id1a". Therefore, the phases of the data "id0a" and data "id1a" input to the selector 230 are shifted by 180° with respect to each other.

The clock signal "data-clk" (first clock signal) output from the buffer 214 is also supplied to the selector 230. The selector 230 may have a configuration corresponding to, for example, the configuration of the selector 110 illustrated in FIG. 1. The selector 230 selects and outputs one of the input data "id0a" and data "id1a", and further switches the selection of data inputs in synchronization with the supplied clock signal "data-clk" (first clock signal).

For example, the selector 230 selects the data "id0a" in synchronization with a rising edge of the clock signal "data-clk" supplied from the buffer 214, and selects the data "id1a" in synchronization with a falling edge of the clock signal "data-clk". The selector 230 outputs the selected data to the flip-flop 240 as data "data".

The flip-flop 240 may have a configuration corresponding to, for example, the configuration of the flip-flop 120 illustrated in FIG. 1. The flip-flop 240 receives the clock signal "clk" (second clock signal) from the input terminal 211. The flip-flop 240 latches the data "data" output from the selector 230 in synchronization with a rising edge of the clock signal "clk". The output of the flip-flop 240 is output to the subsequent stage as the data "odata".

Fixed data "0" ("const0") is input to the input terminal 251. The input fixed data "0" input through the input terminal 251 is input to the selector 253. Fixed data "1" ("const1") is input to the input terminal 252. The input fixed data "1" input through the input terminal 252 is input to the selector 253.

The selector 253 may have a configuration corresponding to, for example, the configuration of the generator 130 illustrated in FIG. 1. The selector 253 selects and outputs one of a plurality of data input through the input terminals 251, 252. The selector 253 further switches the selection of data inputs in synchronization with the switching of the selection of data inputs by the selector 230. For example, the clock signal "data-clk" supplied to the selector 230 is also supplied to the selector 253, and the selector 253 switches the selection of data inputs in synchronization with the supplied clock signal "data-clk".

Specifically, the selector 253 selects the fixed data "0" in synchronization with a rising edge of the supplied clock signal "data-clk", and selects the fixed data "1" in synchronization with a falling edge of the clock signal "data-clk". The selector 253 outputs the selected data to the detector 260 as replica data "rep-data".

The detector 260 may have a configuration corresponding to, for example, the configuration of the detector 140 illustrated in FIG. 1. The detector 260 detects a shift of a falling edge of the clock signal "clk" with respect to each of a first switching point and a second switching point of the replica data "rep-data". The first switching point is, for example, a switching point from the fixed data "0" to the fixed data "1". The second switching point is, for example, a switching point from the fixed data "1" to the fixed data "0". Specifically, the detector 260 includes a flip-flop 261 (FF), a flip-flop 262 (Ph-FF), and a flip-flop 263 (Ph-FF).

The flip-flop 261 may be a replica flip-flop configured to synchronize the replica data "rep-data" output from the selector 253 with a falling edge of the clock signal "clk" output from the input terminal 211. For example, an inverter 261a is connected before the flip-flop 261, and the flip-flop 261 synchronizes the replica data "rep-data" with a rising edge of an inverted signal of the clock signal "clk". Phase data "ph" output from the flip-flop 261 is output to the flip-flops 262 and 263.

The flip-flop 262 may be a first flip-flop configured to synchronize the phase data "ph" output from the flip-flop 261 with a rising edge of the frequency-divided clock signal "div-clk" output from the frequency divider 212. An output "dif1" of the flip-flop 262 is output to the controller 270.

The flip-flop 263 may be a second flip-flop configured to synchronize the phase data "ph" output from the flip-flop 261 with a falling edge of the frequency-divided clock signal "div-clk" output from the frequency divider 212. For example, an inverter 263a is connected before the flip-flop 263, and the flip-flop 263 synchronizes the phase data "ph" with a rising edge of an inverted signal of the frequency-divided clock signal "div-clk". An output "dif2" of the flip-flop 263 is output to the controller 270.

The output "dif1" output from the flip-flop 262 indicates the direction of the shift of the falling edge of the clock signal "clk" with respect to the first switching point of the replica data "rep-data". The output "dif2" output from the flip-flop 263 indicates the direction of the shift of the falling edge of the clock signal "clk" with respect to the second switching point of the replica data "rep-data".

For example, when the rising edge of the clock signal "clk" is delayed with respect to an optimum point of the data "data", the falling edge of the clock signal "clk" is delayed with respect to each of the switching points of the replica data "rep-data". In this case, for example, the output "dif1" is "0" and the output "dif2" is "1". Here, the optimum point of the data "data" is, for example, an intermediate point in the data "data" between the data "id0a" and the data "id1a".

Further, when the rising edge of the clock signal "clk" is advanced with respect to the optimum point of the data "data", the falling edge of the clock signal "clk" is advanced with respect to each of the switching points of the replica data "rep-data". In this case, for example, the output "dif1" is "1" and the output "dif2" is "0".

Further, when the rising edge of the clock signal "clk" coincides with the optimum point of the data "data", the falling edge of the clock signal "clk" coincides with each of the switching points of the replica data "rep-data". In this case, both the outputs "dif1" and "dif2" are "0" or "1".

The controller 270 may have a configuration corresponding to, for example, the configuration of the controller 150 illustrated in FIG. 1. The controller 270 controls the relative phases of the clock signals "data-clk" and "clk" on the basis of the outputs "dif1" and "dif2" output from the detector 260. Specifically, the controller 270 includes a phase controller 272 and a phase determiner (phase determination circuit) 271.

The phase determiner 271 determines the shift of the optimum point of the data "data" with respect to the rising edge of the clock signal "clk" input to the flip-flop 240 on the basis of the outputs "dif1" and "dif2" output from the detector 260. For example, when the output "dif1" is "0" and the output "dif2" is "1", the phase determiner 271 determines that the clock signal "clk" is delayed with respect to the data "data". In this case, the phase determiner 271 outputs a determination result "−1" to the phase controller 272. When the output "dif1" is "1" and the output "dif2" is "0", the phase determiner 271 determines that the clock signal "clk" is advanced with respect to the data "data". In this case, the phase determiner 271 outputs a determination result "+1" to the phase controller 272. Further, when the outputs "dif1" and "dif2" have the same value, the phase determiner 271 determines that the clock signal "clk" has an optimum phase to the data "data". In this case, the phase determiner 271 outputs a determination result "0" to the phase controller 272.

The phase controller 272 controls the relative phases of the clock signals "data-clk" and "clk" on the basis of the determination result output from the phase determiner 271. Specifically, when the determination result "−1" is output from the phase determiner 271, the phase controller 272 controls the desired-phase generator 213 to advance the phase of the clock signal "data-clk". When the determination result "+1" is output from the phase determiner 271, the phase controller 272 controls the desired-phase generator 213 to delay the phase of the clock signal "data-clk". Further, when the determination result "0" is output from the phase determiner 271, the phase controller 272 controls the desired-phase generator 213 to maintain the phase of the clock signal "data-clk".

In this manner, the controller 270 controls the phase of the clock signal "data-clk" in a direction in which the shift of the falling edge of the clock signal "clk" with respect to each of the first and second switching points of the replica data "rep-data" decreases. Alternatively, the controller 270 may also be configured to control the phase of the clock signal "clk" to control the relative phases of the clock signals "data-clk" and "clk".

Figure 3A:
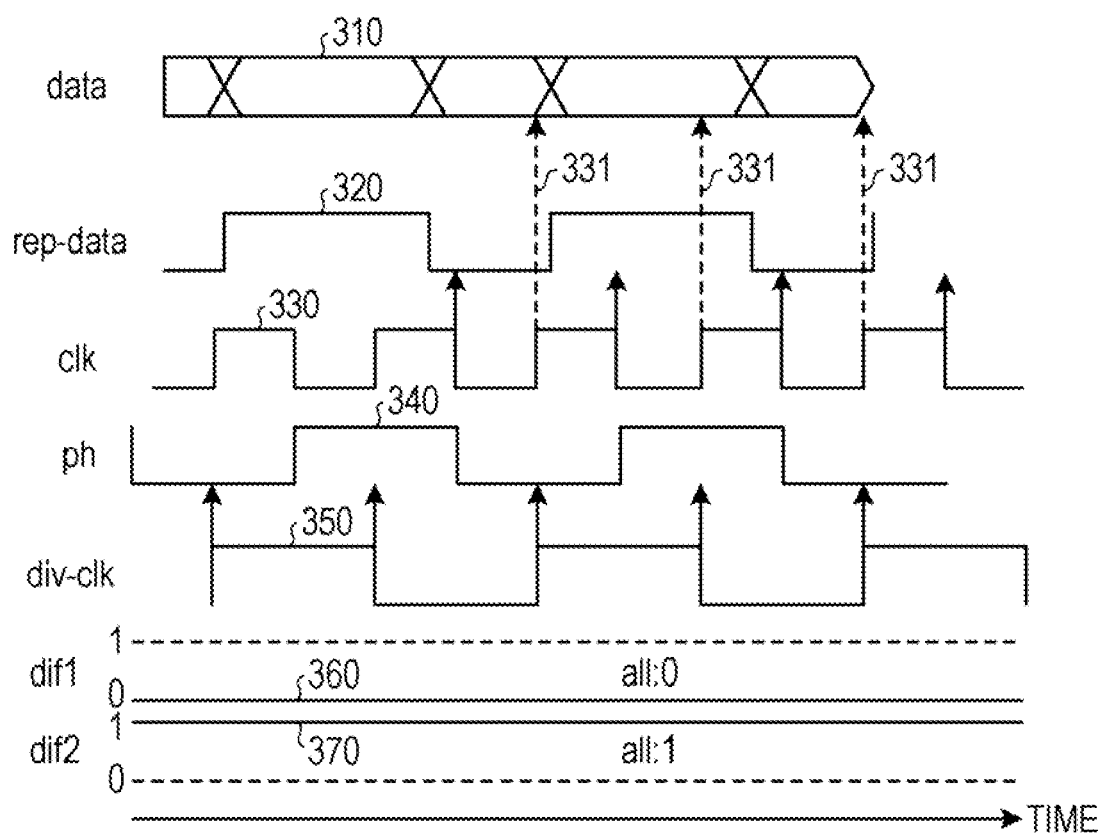
FIG. 3A to FIG. 3C are time charts of the operation of the parallel-serial converter illustrated in FIG. 2.

FIG. 3A is a time chart (part 1) of the operation of the parallel-serial converter 200 illustrated in FIG. 2. FIG. 3A illustrates that rising edges of the clock signal "clk" input to the flip-flop 240 are delayed with respect to optimum points of the data "data" input to the flip-flop 240. In FIG. 3A, the horizontal axis represents time.

Reference numeral 310 represents the data "data" input from the selector 230 to the flip-flop 240. Reference numeral 320 represents the replica data "rep-data" output from the selector 253 to the flip-flop 261. Since the selector 253 switches the selection of data inputs in synchronization with the operation of the selector 230, the switching points of the replica data "rep-data" are synchronous to the switching points of the data "data".

Reference numeral 330 represents the clock signal "clk" input from the input terminal 211 to the flip-flop 261. Reference numeral 331 represents rising edges of the clock signal "clk". As represented by reference numeral 331, the rising edges of the clock signal "clk" are delayed with respect to the optimum points of the data "data". Therefore, the falling edges of the clock signal "clk" are delayed with respect to the switching points of the data "data".

Reference numeral 340 represents the phase data "ph" output from the flip-flop 261. Reference numeral 350 represents the frequency-divided clock signal "div-clk" output from the frequency divider 212. Reference numeral 360 represents the output "dif1" output from the flip-flop 262 to the phase determiner 271. Reference numeral 370 represents the output "dif2" output from the flip-flop 263 to the phase determiner 271.

Here, the output "dif1" is always "0" (all:0) and the output "dif2" is always "1" (all:1). In this case, the phase of the clock signal "data-clk" is delayed under the control of the controller 270. Thus, the phase of the data "data" is delayed so that the rising edges of the clock signal "clk" may approach the optimum points of the data "data".

Figure 3B:
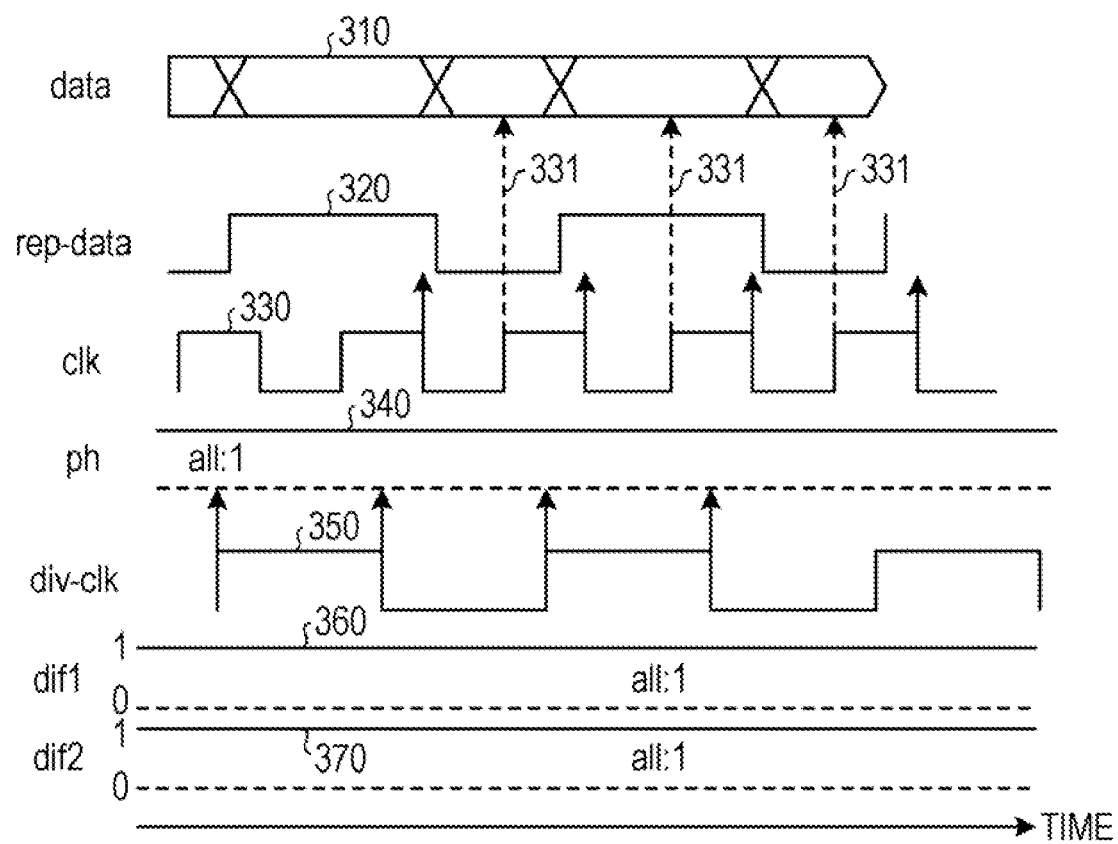

FIG. 3B is a time chart (part 2) of the operation of the parallel-serial converter 200 illustrated in FIG. 2. FIG. 3B illustrates that the rising edges of the clock signal "clk" input to the flip-flop 240 coincide with the optimum points of the data "data" input to the flip-flop 240. In FIG. 3B, portions similar to those illustrated in FIG. 3A are represented by the same reference numerals and descriptions thereof are omitted.

In FIG. 3B, as represented by reference numeral 331, the rising edges of the clock signal "clk" substantially coincide with the optimum points of the data "data". However, since the duty ratio of the data "data" is not 50%, the replica data "rep-data" is always "1" at the falling time of the clock signal "clk". Thus, as represented by reference numeral 340, the phase data "ph" output from the flip-flop 261 is always "1" (all:1). Therefore, as represented by reference numerals 360 and 370, the outputs "dif1" and "dif2" are always "1" (all:1). In this case, the phase of the clock signal "data-clk" is maintained under the control of the controller 270. Thus, the rising edges of the clock signal "clk" may be maintained to coincide with the optimum points of the data "data".

Figure 3C:
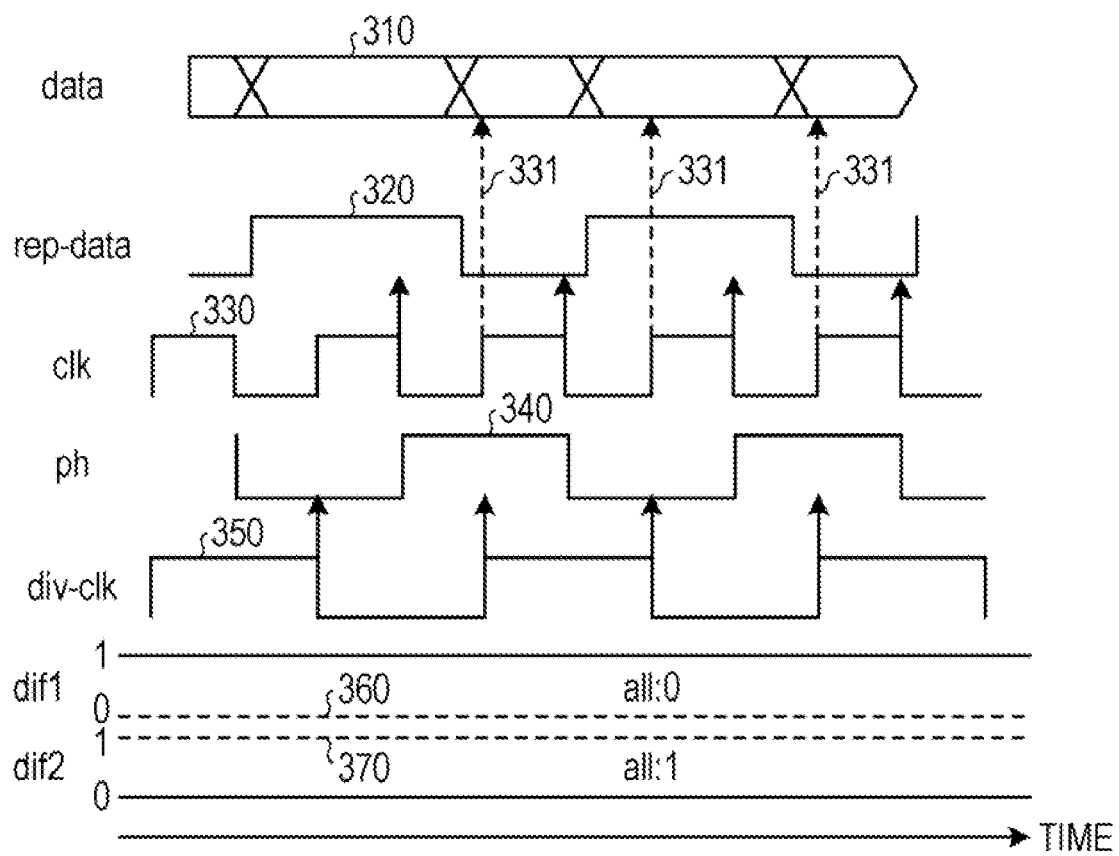

FIG. 3C is a time chart (part 3) of the operation of the parallel-serial converter 200 illustrated in FIG. 2. FIG. 3C illustrates that the rising edges of the clock signal "clk" input to the flip-flop 240 are advanced with respect to the optimum points of the data "data" input to the flip-flop 240. In FIG. 3C, portions similar to those illustrated in FIG. 3A are represented by the same reference numerals and descriptions thereof are omitted.

In FIG. 3C, as represented by reference numeral 331, the rising edges of the clock signal "clk" are advanced with respect to the optimum points of the data "data". Therefore, the falling edges of the clock signal "clk" are advanced with respect to the switching points of the data "data". Here, the output "dif1" is always "1" (all:1) and the output "dif2" is always "0" (all:0). In this case, the phase of the clock signal "data-clk" is advanced under the control of the controller 270. Thus, the phase of the data "data" is advanced so that the rising edges of the clock signal "clk" may approach the optimum points of the data "data".

As illustrated in FIGS. 3A to 3C, when the timings of the clock signal "clk" and the data "data" are optimum (FIG. 3B) and when the clock signal "clk" is advanced with respect to the data "data" (FIG. 3C), the output "dif1" is always "1". Therefore, when only the output "dif1" is detected, it is difficult to distinguish the above cases from each other.

In contrast, the parallel-serial converter 200 detects the outputs "dif1" and "dif2", thus allowing accurate determination of a shift between a rising edge of the clock signal "clk" and an optimum point of the data "data" even when the duty ratio of the data "data" is not 50%. Thus, the parallel-serial converter 200 may accurately shape the data "data" even when the duty ratio of the data "data" is not 50%.

Note that the data "data" and the clock signal "clk" have noise or jitter and which of "0" and "1" each of the outputs "dif1" and "dif2" is stochastically changes. Phase control based on the stochastic change in the outputs "dif1" and "dif2" will now be described with reference to FIGS. 4 to 7.

Figure 4:
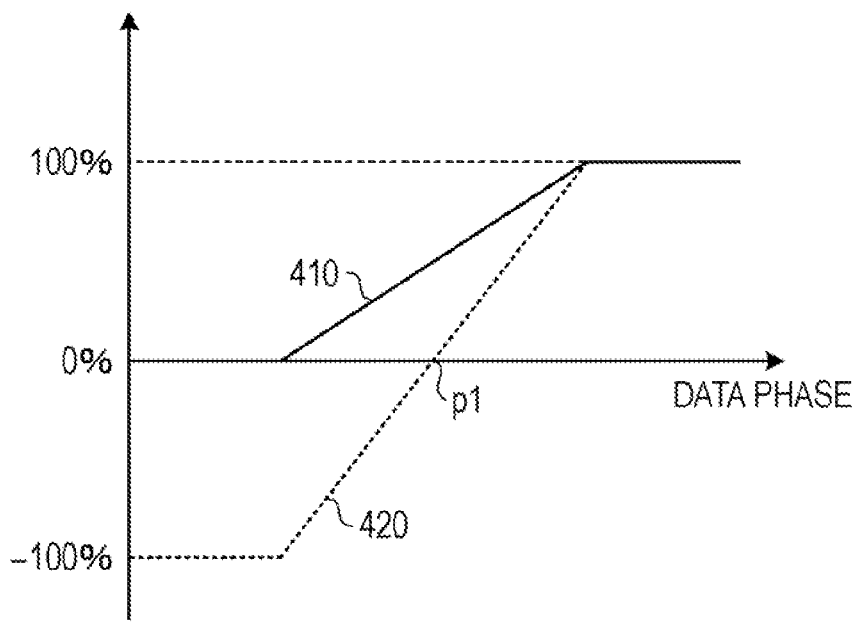
FIG. 4 is a reference diagram illustrating phase control (duty ratio=50%) based on only the output "dif1"

FIG. 4 is a reference diagram illustrating phase control (duty ratio=50%) based on only the output "dif1". In FIG. 4, the horizontal axis represents the phase (data phase) of the clock signal "data-clk" controlled by the controller 270. A phase p1 on the horizontal axis indicates an optimum phase of the clock signal "data-clk". The vertical axis represents probability. In FIG. 4, a case where the duty ratio of the data "data" is 50% and where it is assumed that the controller 270 performs phase control based on only the output "dif1" is illustrated for reference.

For example, the controller 270 may perform phase control to delay the phase of the clock signal "data-clk" when the output "dif1" is "1" and to advance the phase of the clock signal "data-clk" when the output "dif1" is "0".

Relationship 410 represents the relationship between the phase of the clock signal "data-clk" and the probability that the output "dif1" is "1". As represented by Relationship 410, when the phase of the clock signal "data-clk" is greatly delayed with respect to the phase p1, the probability that the output "dif1" is "1" is 0%. When the phase of the clock signal "data-clk" is greatly advanced with respect to the phase p1, the probability that the output "dif1" is "1" is 100%.

When the phase of the clock signal "data-clk" is close to the phase p1, the probability that the output "dif1" is "1" increases as the phase of the clock signal "data-clk" is advanced. The amount of change in the phase of the clock signal "data-clk" is proportional to the value given by [probability that the output "dif1" is "1"]–[probability that the output "dif1" is "0"].

Relationship 420 represents the relationship between the phase of the clock signal "data-clk" and the value given by [probability that the output "dif1" is "1"]–[probability that the output "dif1" is "0"]. Under the control of the controller 270, the phase of the clock signal "data-clk" converges to a phase that allows the probability of Relationship 420 to be 0%. Therefore, the phase of the clock signal "data-clk" converges to the optimum phase p1.

Figure 5:
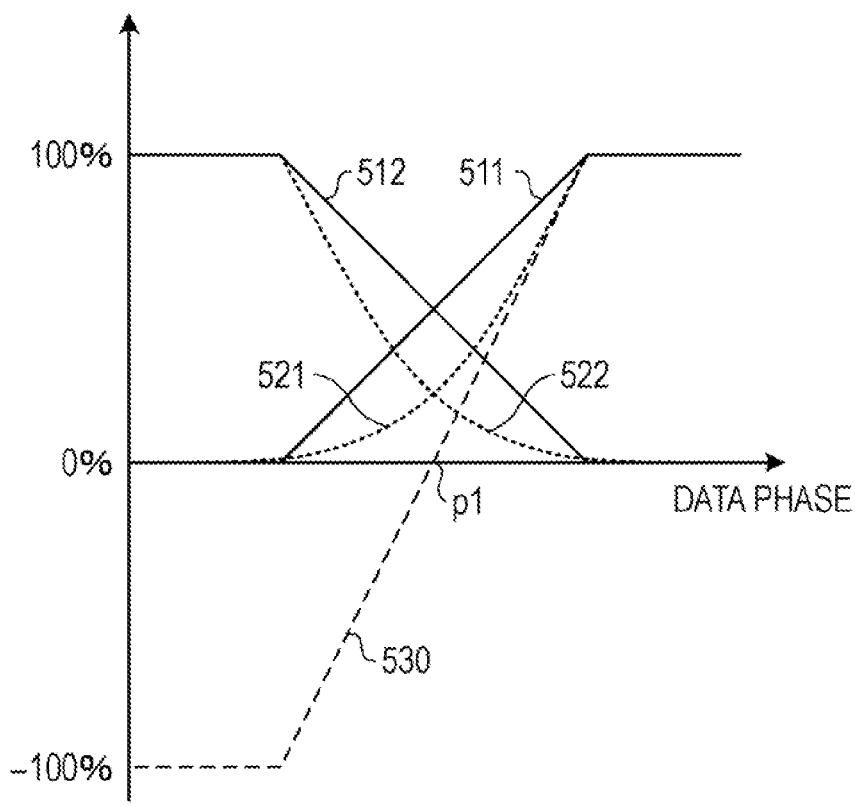
FIG. 5 is a diagram illustrating phase control (duty ratio=50%) based on the outputs "dif1" and "dif2"

FIG. 5 is a diagram illustrating phase control (duty ratio=50%) based on the outputs "dif1" and "dif2". FIG. 5 illustrates a case where the duty ratio of the clock signal "data-clk" is 50% and where the controller 270 performs phase control based on the outputs "dif1" and "dif2". In FIG. 5, portions similar to those illustrated in FIG. 4 are represented by the same reference numerals and descriptions thereof are omitted.

Relationship 511 represents the relationship between the phase of the clock signal "data-clk" and the probability that the output "dif1" is "1". Relationship 512 represents the relationship between the phase of the clock signal "data-clk" and the probability that the output "dif2" is "1".

Relationship 521 represents the relationship between the phase of the clock signal "data-clk" and the probability that the output "dif1" is "1" and that the output "dif2" is "0". Relationship 522 represents the relationship between the phase of the clock signal "data-clk" and the probability that the output "dif1" is "0" and that the output "dif2" is "1".

The amount of change in the phase of the clock signal "data-clk" is proportional to the value given by [probability that the output "dif1" is "1" and that the output "dif2" is "0"]−[probability that the output "dif1" is "0" and that the output "dif2" is "1"]. Relationship 530 is obtained by subtracting Relationship 522 from Relationship 521. That is, Relationship 530 represents the relationship between the phase of the clock signal "data-clk" and the value given by [probability that the output "dif1" is "1" and that the output "dif2" is "0"]−[probability that the output "dif1" is "0" and that the output "dif2" is "1"].

Under the control of the controller 270, the phase of the clock signal "data-clk" converges to a phase that allows the probability of Relationship 530 to be 0%. Therefore, the phase of the clock signal "data-clk" converges to the optimum phase p1. In this manner, under the control of the controller 270, the phase of the clock signal "data-clk" may be made to converge to the optimum phase p1 and a rising edge of the clock signal "clk" may be made to approach an optimum point of the data "data".

Figure 6:
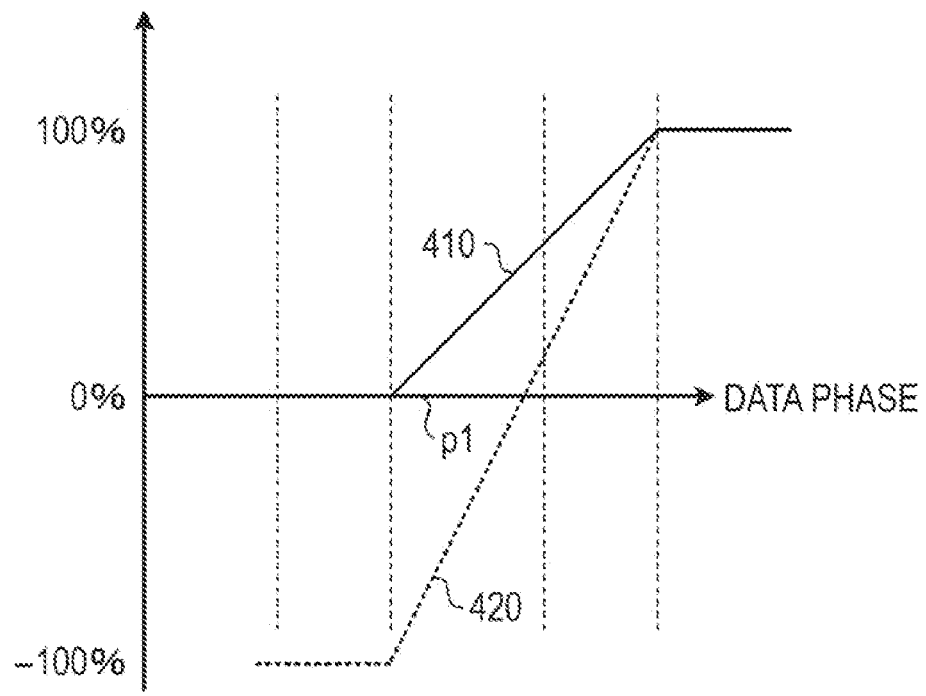
FIG. 6 is a reference diagram illustrating phase control (duty ratio≠50%) based on only the output "dif1"

FIG. 6 is a reference diagram illustrating phase control (duty ratio≠50%) based on only the output "dif1". In FIG. 6, a case where the duty ratio of the data "data" is not 50% and where it is assumed that the controller 270 performs phase control based on only the output "dif1" is illustrated for reference. In FIG. 6, portions similar to those illustrated in FIG. 4 are represented by the same reference numerals and descriptions thereof are omitted.

As represented by Relationship 420 in FIG. 6, when the duty ratio of the data "data" is not 50%, the phase of the clock signal "data-clk" obtained when the probability of Relationship 420 is 0% is not equal to the phase p1. Therefore, when the controller 270 performs phase control based on only the output "dif1", it is difficult to accurately shape the data "data".

Figure 7:
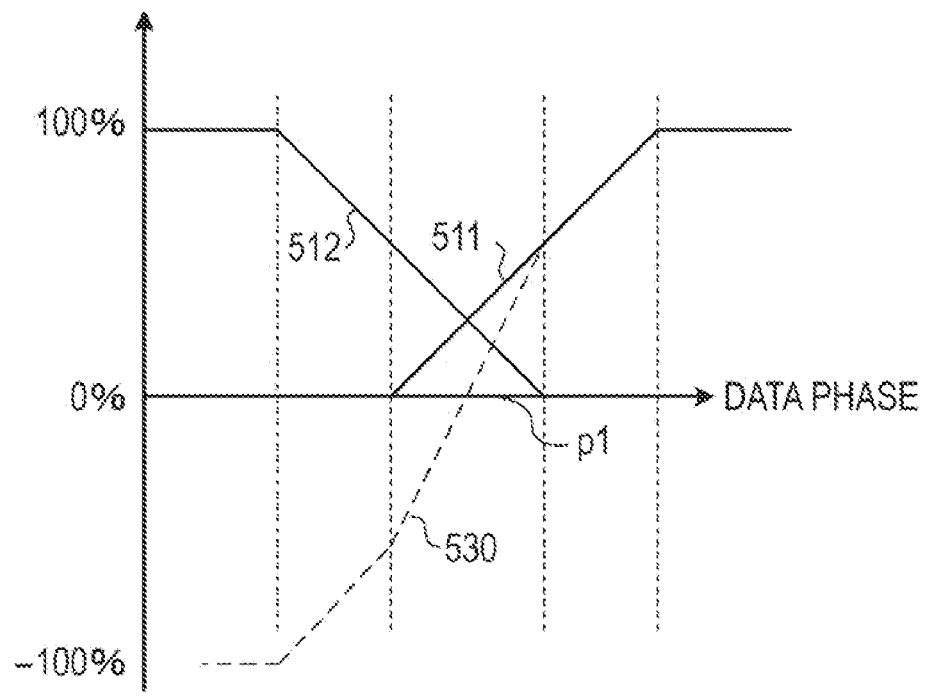
FIG. 7 is a diagram illustrating phase control (duty ratio≠50%) based on the outputs "dif1" and "dif2"

FIG. 7 is a diagram illustrating phase control (duty ratio≠50%) based on the outputs "dif1" and "dif2". FIG. 7 illustrates a case where the duty ratio of the data "data" is not 50% and where the controller 270 performs phase control based on the outputs "dif1" and "dif2". In FIG. 7, portions similar to those illustrated in FIG. 5 are represented by the same reference numerals and descriptions thereof are omitted.

As represented by Relationship 530 in FIG. 7, even when the duty ratio of the clock signal "data-clk" is not 50%, the phase of the clock signal "data-clk" obtained when the probability of Relationship 530 is 0% is equal to the optimum phase p1. Therefore, under the control of the controller 270, the phase of the clock signal "data-clk" may be made to converge to the optimum phase p1.

Accordingly, the parallel-serial converter 200 according to the second embodiment detects a shift of a falling edge of the clock signal "clk" with respect to a switching point of the replica data "rep-data". The parallel-serial converter 200 may use the detected shift to control the rising time of the clock signal "clk" with respect to the data "data" as desired. Therefore, the data "data" may accurately be shaped.

The parallel-serial converter 200 further detects a shift of a rising edge of the second clock signal with respect to each of a first switching point and a second switching point of the replica data "rep-data". Thus, even when the duty ratio of the data "data" is not 50%, a shift of a rising edge of the clock signal "clk" with respect to the data "data" may accurately be detected, and the data "data" may accurately be shaped.

Third Embodiment

Figure 8:
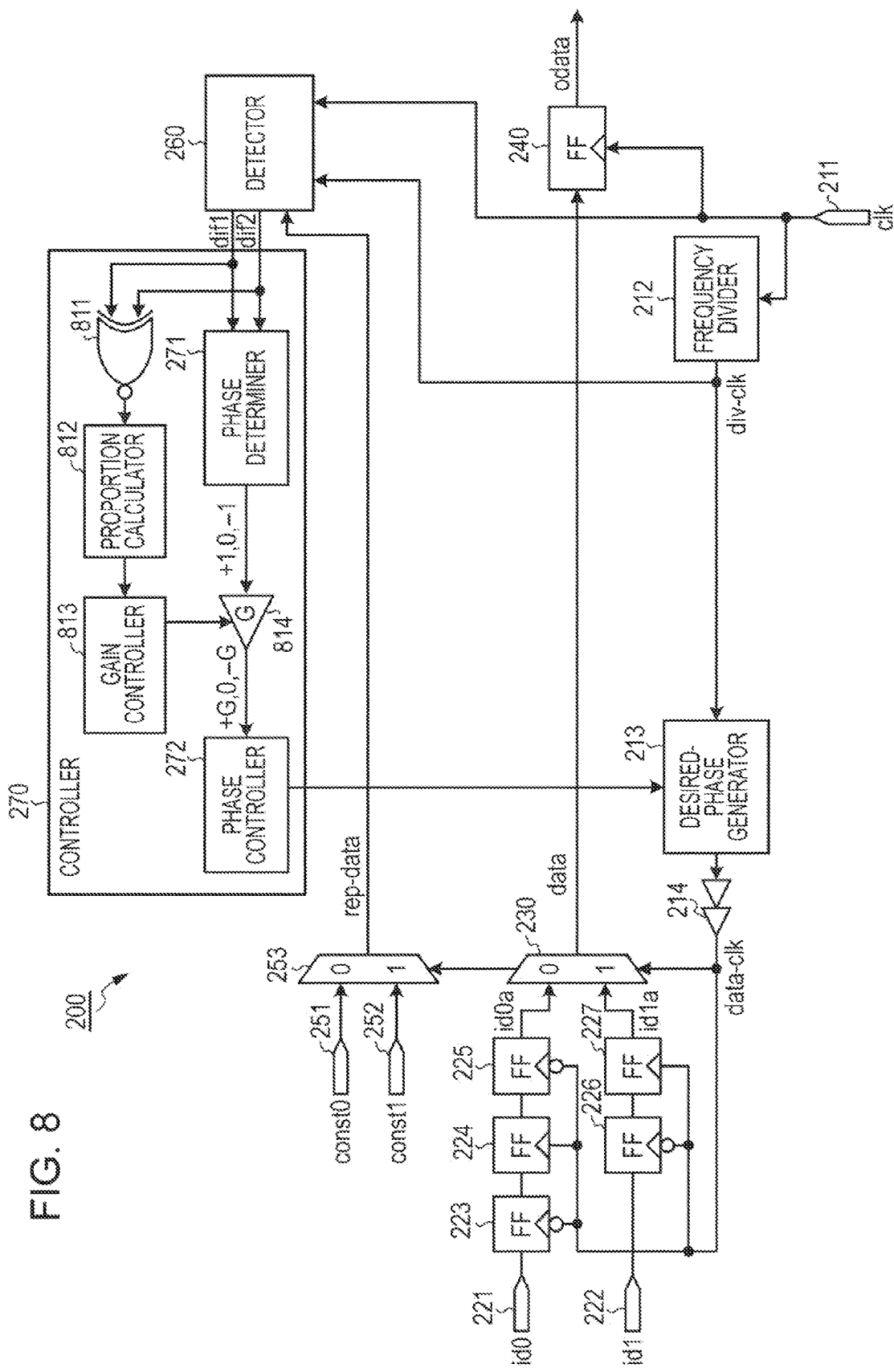
FIG. 8 is a diagram illustrating the configuration of a parallel-serial converter according to a third embodiment.

FIG. 8 is a diagram illustrating the configuration of a parallel-serial converter according to a third embodiment. In FIG. 8, elements similar to those illustrated in FIG. 2 are represented by the same reference numerals and descriptions thereof are omitted. As illustrated in FIG. 8, a controller 270 of a parallel-serial converter 200 according to the third embodiment includes, in addition to the configuration illustrated in FIG. 2, an exclusive NOR (exclusive NOR circuit) 811, a proportion calculator (proportion calculation circuit) 812, a gain controller (gain control circuit) 813, and a gain circuit 814.

The gain circuit 814 amplifies the determination result ("+1", "0", or "−1") output from the phase determiner 271 by a gain G, and outputs the determination result to the phase controller 272. The determination result output to the phase controller 272 may be "+G", "0", or "−G". The gain G of the gain circuit 814 is controlled by the gain controller 813.

When the determination result "−G" is output from the phase determiner 271, the phase controller 272 controls the desired-phase generator 213 to delay the phase of the clock signal "data-clk" by an amount corresponding to the gain G. When the determination result "+G" is output from the phase determiner 271, the phase controller 272 controls the desired-phase generator 213 to advance the phase of the clock signal "data-clk" by an amount corresponding to the gain G.

The exclusive NOR 811 calculates the inverse of the exclusive OR between the outputs "dif1" and "dif2" output from the detector 260, and outputs the calculation result to the proportion calculator 812. The proportion calculator 812 calculates the proportion of the calculation results that are "1" output from the exclusive NOR 811. The proportion calculated by the proportion calculator 812 indicates the proportion of a combination of values of the outputs "dif1" and "dif2" that are "11" or "00" among all combinations of values of the outputs "dif1" and "dif2" output from the detector 260.

The proportion calculator 812 notifies the gain controller 813 of the calculated proportion. The gain controller 813 controls the gain circuit 814 to increase the gain G of the gain circuit 814 as the proportion notified by the proportion calculator 812 increases. In this manner, the controller 270 increases the unit amount of control for the relative latch timings of the flip-flop 240 with respect to the switching of parallel data by the selector 230 as the proportion that the values of the outputs "dif1" and "dif2" are the same increases.

Figure 9A:
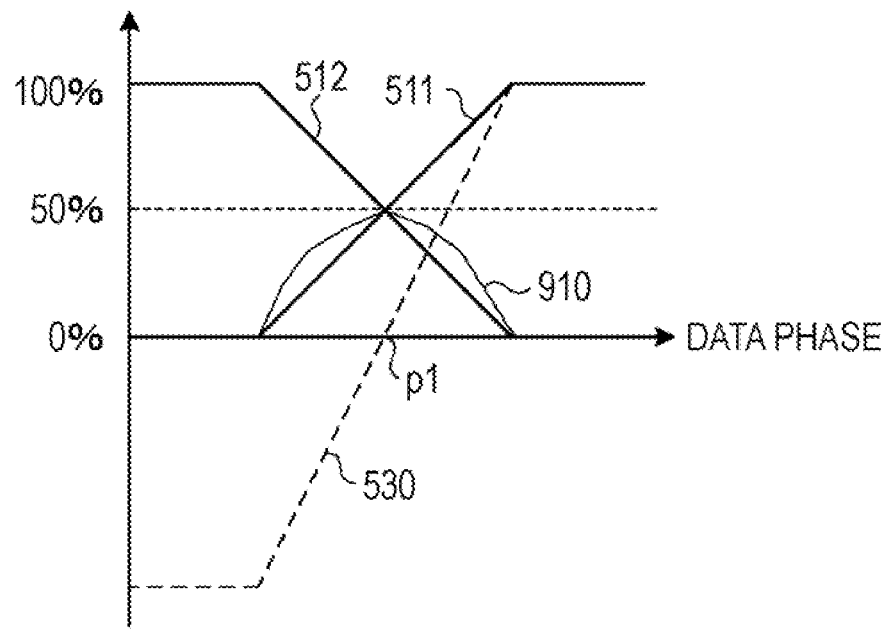
FIG. 9A to FIG. 9C are diagrams illustrating the probability that the outputs "dif1" and "dif2" have the same value.

FIG. 9A is a diagram (part 1) illustrating the probability that the outputs "dif1" and "dif2" have the same value. In FIG. 9A, portions similar to those illustrated in FIG. 5 are represented by the same reference numerals and descriptions thereof are omitted. Relationship 910 represents the relationship between the phase of the clock signal "data-clk" and the probability that the outputs "dif1" and "dif2" have the same value ("1" or "0") when the duty ratio of the data "data" is deviated from 50%. As represented by Relationship 910, when the phase of the clock signal "data-clk" approaches the phase p1, the probability that the outputs "dif1" and "dif2" have the same value increases.

Figure 9B:
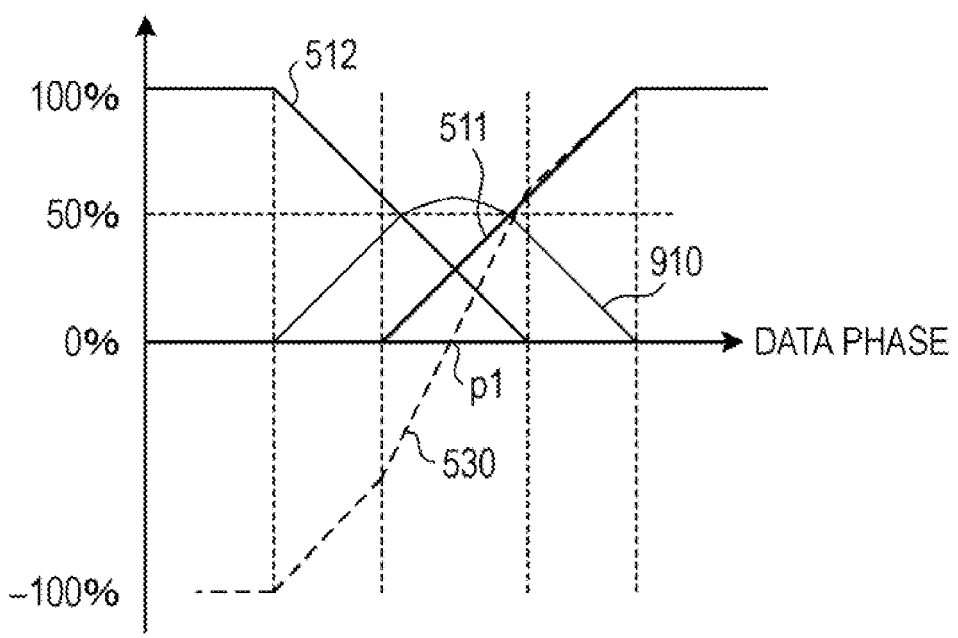
Figure 9C:
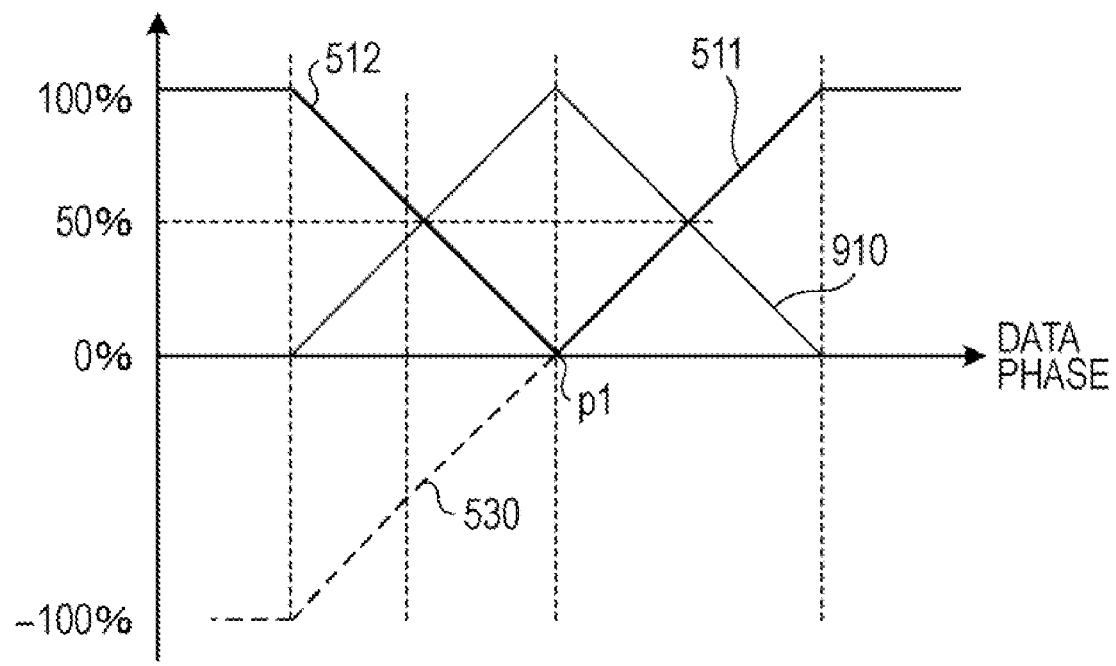

FIGS. 9B and 9C are diagrams illustrating the probability that the outputs "dif1" and "dif2" have the same value. In FIGS. 9B and 9C, portions similar to those illustrated in FIG. 9A are represented by the same reference numerals and descriptions thereof are omitted.

FIG. 9B illustrates that the duty ratio of the data "data" is more deviated from 50% than that illustrated in FIG. 9A. In this case, as represented by Relationship 910 in FIG. 9B, the probability that the outputs "dif1" and "dif2" have the same value further increases. FIG. 9C illustrates that the duty ratio of the data "data" is more deviated from 50% than that illustrated in FIG. 9B. In this case, as represented by Relationship 910 in FIG. 9C, the probability that the outputs "dif1" and "dif2" have the same value further increases.

As represented by Relationship 530 in FIGS. 9A to 9C, the more the duty ratio of the clock signal "data-clk" is deviated from 50%, the less the change in the probability with respect to the phase of the clock signal "data-clk". Therefore, the more the duty ratio of the clock signal "data-clk" is deviated from 50%, the longer the time is required for the phase of the clock signal "data-clk" to converge to the phase p1. Thus, the shaping accuracy of serial data is reduced.

Furthermore, as represented by Relationship 910 in FIGS. 9A to 9C, the more the duty ratio of the clock signal "data-clk" is deviated from 50%, the higher the probability that the outputs "dif1" and "dif2" have the same value.

The controller 270 increases the unit amount of control of the phase of the clock signal "data-clk" as the proportion that the values of the outputs "dif1" and "dif2" are the same increases. Thus, the more the duty ratio of the clock signal "data-clk" is deviated from 50%, the larger the unit amount of control of the phase of the clock signal "data-clk" may be. Therefore, even when the duty ratio of the clock signal "data-clk" is deviated from 50%, the time required for the clock signal "data-clk" to converge to the optimum phase p1 may be reduced.

Figure 10:
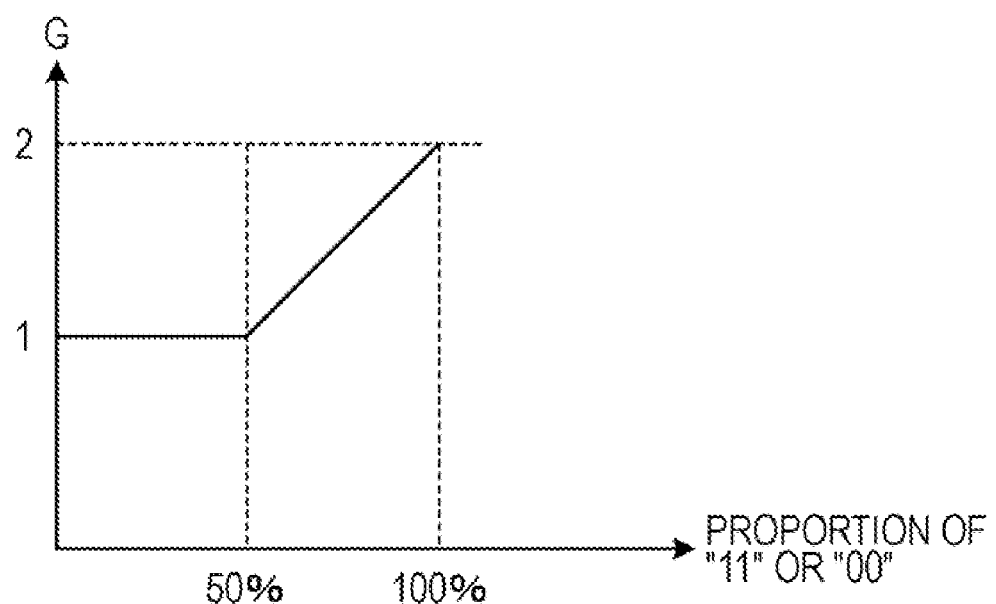
FIG. 10 is a diagram illustrating an example of gain control performed by a gain controller.

FIG. 10 is a diagram illustrating an example of gain control performed by the gain controller 813. In FIG. 10, the horizontal axis represents the proportion of a combination of values of the outputs "dif1" and "dif2" that are "11" or "00". The vertical axis represents the gain G in the gain circuit 814. When the proportion of a combination of values of the outputs "dif1" and "dif2" that are "11" or "00" is less than or equal to 50%, the gain controller 813 controls the gain G to 1.

When the proportion of a combination of values of the outputs "dif1" and "dif2" that are "11" or "00" is greater than 50%, the gain controller 813 increases the gain G in accordance with the increase in the proportion of the combination of values that are "11" or "00". Further, when the proportion of a combination of values of the outputs "dif1" and "dif2" that are "11" or "00" is 100%, the gain controller 813 controls the gain G to 2.

In this manner, the gain controller 813 controls the gain circuit 814 to increase the gain G of the gain circuit 814 as the proportion notified by the proportion calculator 812 increases. A description has been given of a case where the gain G is successively increased when the proportion of the values that are "11" or "00" exceeds 50%. Alternatively, the gain controller 813 may provide stepwise threshold values for the proportion of the values that are "11" or "00" so that the gain G may be increased stepwise each time the proportion of the values that are "11" or "00" exceeds the threshold values.

Figure 11:
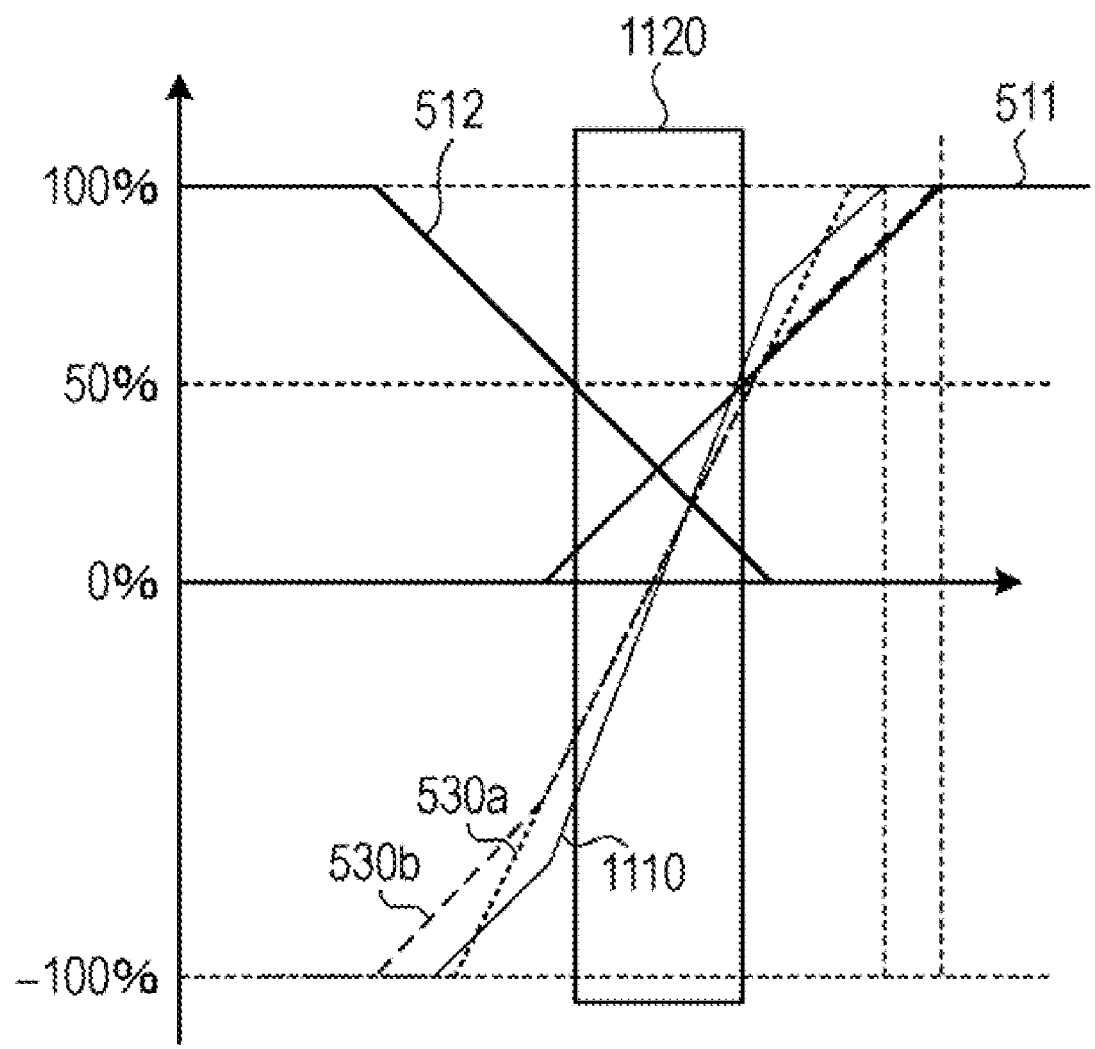
FIG. 11 is a diagram illustrating phase control in accordance with gain control.

FIG. 11 is a diagram illustrating phase control in accordance with gain control. In FIG. 11, portions similar to those illustrated in FIG. 5 are represented by the same reference numerals and descriptions thereof are omitted. In FIG. 11, Relationship 530a corresponds to Relationship 530 illustrated in FIG. 5 (duty ratio=50%). Relationship 530b corresponds to Relationship 530 illustrated in FIG. 7 (duty ratio≠50%).

Relationship 1110 represents Relationship 530b that is obtained when the unit amount of control of the phase of the clock signal "data-clk" is large under the control of the gain controller 813. Here, the gain G is increased within a range 1120 in which the proportion of the values that are "11" or "00" exceeds 50%. In Relationship 1110, compared to Relationship 530b, the change in the probability with respect to the phase of the clock signal "data-clk" is large. Therefore, the time required for the clock signal "data-clk" to converge to the optimum phase p1 may be reduced even when the duty ratio is deviated from 50%.

In this manner, the parallel-serial converter 200 according to the third embodiment increases the unit amount of control of timing control of the clock signals "data-clk" and "clk" as the proportion of the values of the outputs "dif1" and "dif2" that are the same increases. Therefore, advantages similar to those of the parallel-serial converter 200 according to the second embodiment may be achieved. In addition, even when the duty ratio is deviated from 50%, the time required for the clock signal "data-clk" to converge to the optimum phase p1 may be reduced. Thus, the data "data" may more accurately be shaped.

Fourth Embodiment

Figure 12:
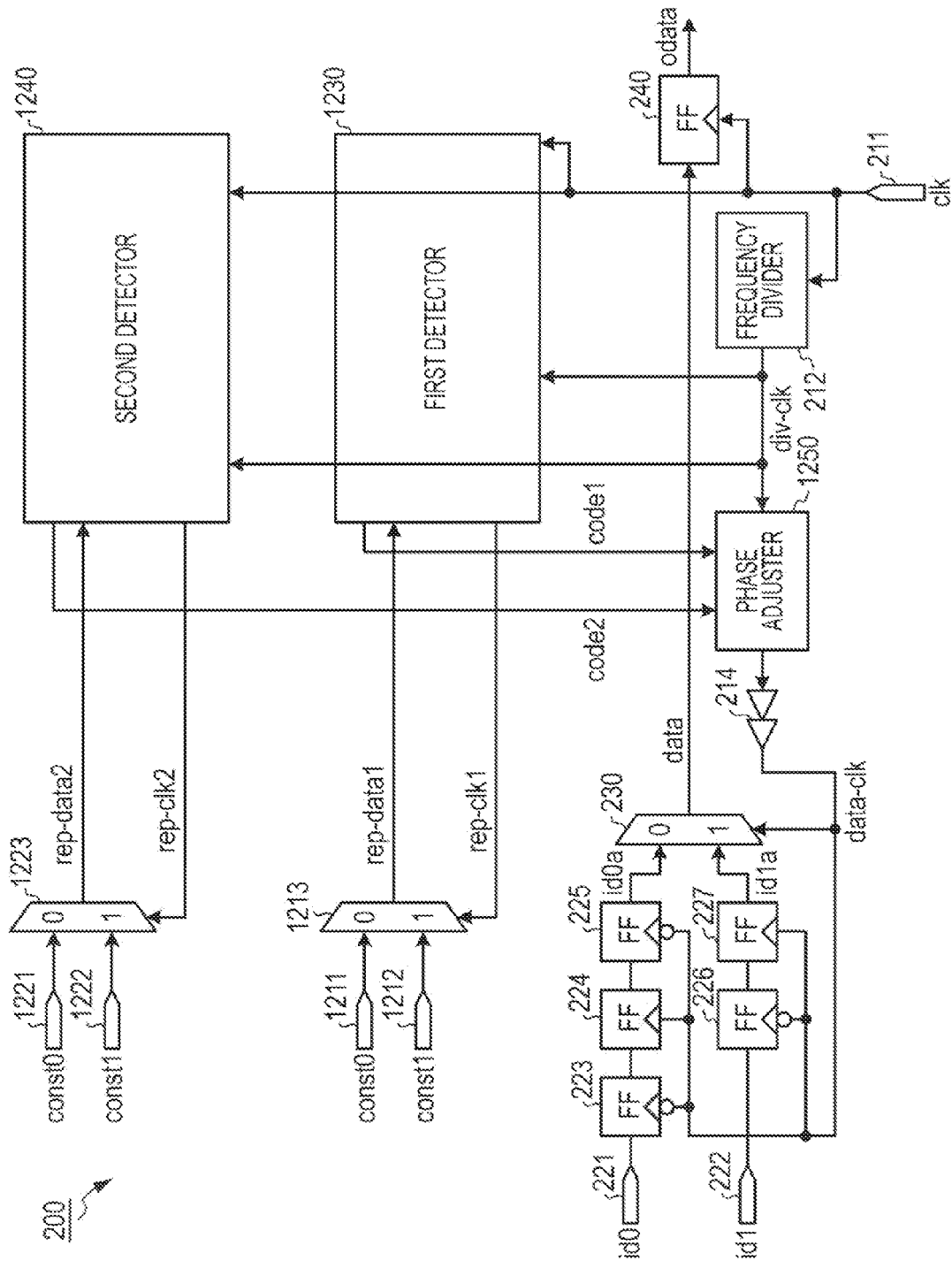
FIG. 12 is a diagram illustrating the configuration of a parallel-serial converter according to a fourth embodiment.

FIG. 12 is a diagram illustrating the configuration of a parallel-serial converter according to a fourth embodiment. In FIG. 12, elements similar to those illustrated in FIG. 2 are represented by the same reference numerals and descriptions thereof are omitted. As illustrated in FIG. 12, a parallel-serial converter 200 according to the fourth embodiment includes an input terminal 211, a frequency divider 212, a buffer 214, input terminals 221 and 222, flip-flops 223 to 227, a selector 230, a flip-flop 240, input terminals 1211 and 1212, a selector 1213, input terminals 1221 and 1222, a selector 1223, a first detector 1230, a second detector 1240, and a phase adjuster 1250.

An input clock signal "clk" input through the input terminal 211 is input to the frequency divider 212, the flip-flop 240, the first detector 1230, and the second detector 1240. The frequency divider 212 outputs a generated frequency-divided clock signal "div-clk" to the first detector 1230, the second detector 1240, and the phase adjuster 1250.

Fixed data "0" (const0) is input to the input terminal 1211. The input fixed data "0" input through the input terminal 1211 is input to the selector 1213. Fixed data "1" (const1) is input to the input terminal 1212. The input fixed data "1" input through the input terminal 1212 is input to the selector 1213.

Each of the selectors 1213 and 1223 may have a configuration corresponding to, for example, the configuration of the generator 130 illustrated in FIG. 1. The selector 1213 selects and outputs one of the fixed data inputs. The selector 1213 further switches the selection of the fixed data inputs in synchronization with a replica clock signal "rep-clk1" output from the first detector 1230. For example, the selector 1213 selects the fixed data "0" in synchronization with a rising edge of the supplied replica clock signal "rep-clk1", and selects the fixed data "1" in synchronization with a falling edge of the replica clock signal "rep-clk 1". The selector 1213 outputs the selected data to the first detector 1230 as replica data "rep-data1" (first replica data).

Fixed data "0" (const0) is input to the input terminal 1221. The input fixed data "0" input through the input terminal 1221 is input to the selector 1223. Fixed data "1" (const1) is input to the input terminal 1222. The input fixed data "1" input through the input terminal 1222 is input to the selector 1223.

The selector 1223 selects and outputs one of the fixed data inputs. The selector 1223 further switches the selection of the fixed data inputs in synchronization with a replica clock signal "rep-clk2" output from the second detector 1240. Specifically, the fixed data "0" supplied from the input terminal 1221 and the fixed data "1" supplied from the input terminal 1222 are input to the selector 1223. The selector 1223 selects the fixed data "0" in synchronization with a rising edge of the supplied replica clock signal "rep-clk2", and selects the fixed data "1" in synchronization with a falling edge of the replica clock signal "rep-clk2". The selector 1223 outputs the selected data to the second detector 1240 as replica data "rep-data2" (second replica data).

Each of the first detector 1230 and the second detector 1240 may have a configuration corresponding to, for example, the configuration of the detector 140 illustrated in FIG. 1. The first detector 1230 detects a first switching point of the replica data "rep-data1" output from the selector 1213. The first switching point is, for example, a switching point from the fixed data "0" to the fixed data "1". The first detector 1230 further generates a phase code "code1" (first phase code) indicating the detected first switching point of the replica data "rep-data1". The first detector 1230 outputs the generated phase code "code1" to the phase adjuster 1250.

Further, the first detector 1230 outputs a replica clock signal "rep-clk1" having the same duty ratio as the clock signal "data-clk" to the selector 1213. The selector 1213 may therefore generate the replica data "rep-data1" having the same duty ratio as the clock signal "data-clk".

The second detector 1240 detects a second switching point of the replica data "rep-data2" output from the selector 1223. The second switching point is, for example, a switching point from the fixed data "1" to the fixed data "0". The second detector 1240 further generates a phase code "code2" (second phase code) indicating the detected second switching point of the replica data "rep-data2", and outputs the generated phase code "code2" to the phase adjuster 1250.

Further, the second detector 1240 outputs a replica clock signal "rep-clk 2" having the same duty ratio as the clock signal "data-clk" to the selector 1223. The selector 1223 may therefore generate the replica data "rep-data2" having the same duty ratio as the clock signal "data-clk".

The phase adjuster 1250 adjusts the phase of the clock signal "data-clk" so as to become an intermediate phase between the phase indicated by the phase code "code1" output from the first detector 1230 and the phase indicated by the phase code "code2" output from the second detector 1240. In this manner, the phase of the clock signal "data-clk" is controlled on the basis of the intermediate phase of the switching points detected by the first detector 1230 and the second detector 1240.

Figure 13:
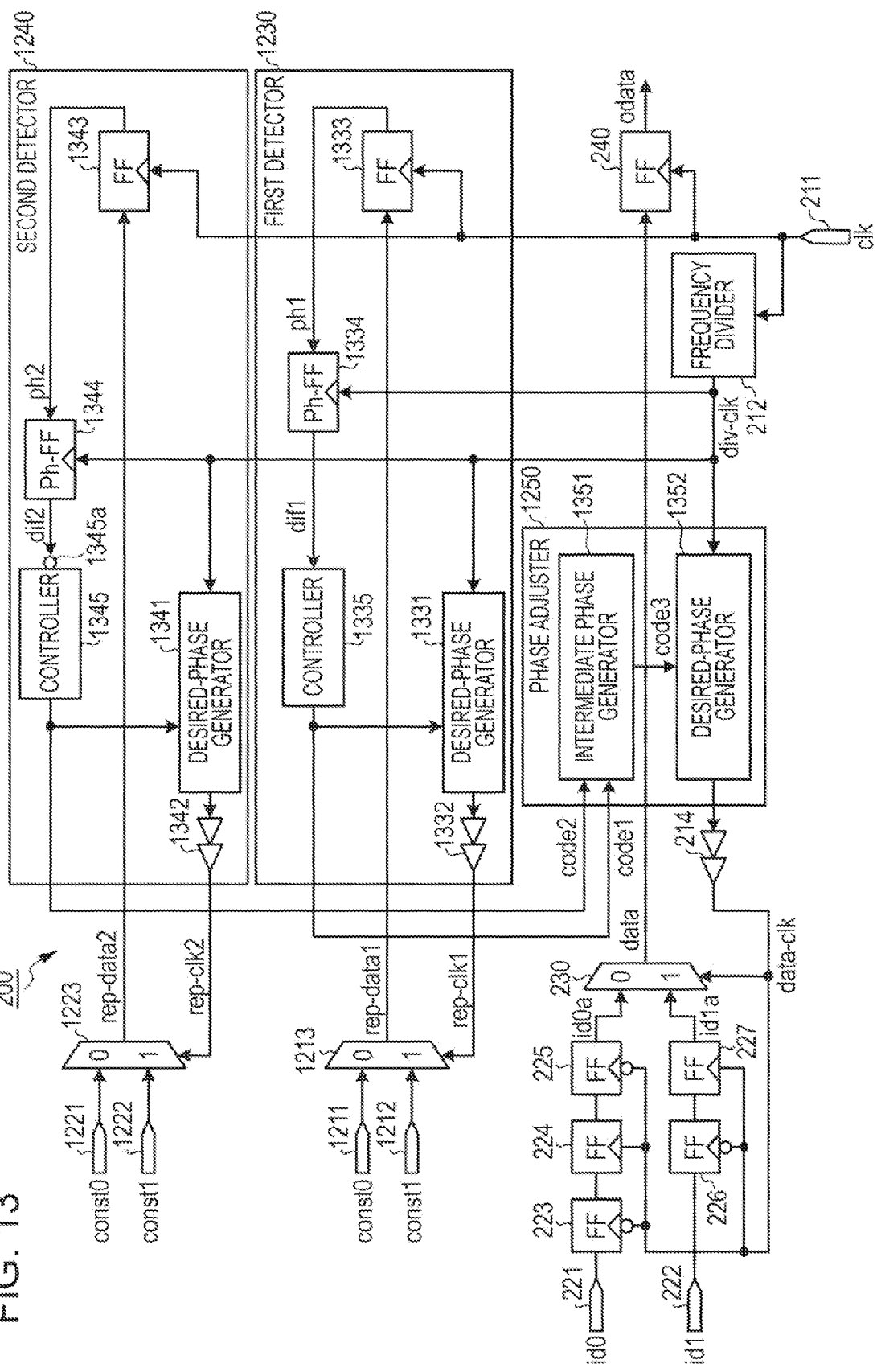
FIG. 13 is a diagram illustrating a specific example of the parallel-serial converter illustrated in FIG. 12.

FIG. 13 is a diagram illustrating a specific example of the parallel-serial converter 200 illustrated in FIG. 12. In FIG. 13, elements similar to those illustrated in FIG. 12 are represented by the same reference numerals and descriptions thereof are omitted. As illustrated in FIG. 13, the first detector 1230 includes a desired-phase generator 1331, a buffer 1332, a flip-flop (FF) 1333, a flip-flop (Ph-FF) 1334, and a controller 1335.

The desired-phase generator 1331 may be a phase interpolation circuit configured to generate a frequency-divided clock signal having a desired phase based on the multiphase frequency-divided clock signal "div-clk" having different phases output from the frequency divider 212. The desired-phase generator 1331 changes the phase of the frequency-divided clock signal to be generated under the control of the controller 1335. The desired-phase generator 1331 outputs the generated frequency-divided clock signal to the buffer 1332.

The buffer 1332 amplifies the frequency-divided clock signal output from the desired-phase generator 1331. The buffer 1332 outputs the amplified frequency-divided clock signal to the selector 1213 as the replica clock signal "rep-clk 1". The buffer 1332 may be, for example, a buffer having delay characteristics equivalent to those of the buffer 214.

The flip-flop 1333 latches the replica data "rep-data1" output from the selector 1213 in synchronization with a rising edge of the clock signal "clk" input through the input terminal 211. An output "ph1" of the flip-flop 1333 is output to the flip-flop 1334.

The flip-flop 1334 latches the output "ph1" from the flip-flop 1333 in synchronization with a rising edge of the frequency-divided clock signal "div-clk" output from the frequency divider 212. An output "dif1" of the flip-flop 1334 is output to the controller 1335.

The output "dif1" output from the flip-flop 1334 indicates the direction of a shift of a rising edge of the clock signal "clk" with respect to a first switching point (a switching point from "0" to "1") of the replica data "rep-data1". For example, when the rising edge of the clock signal "clk" is advanced with respect to the first switching point of the replica data "rep-data1", the output "dif1" is always "0". When the rising edge of the clock signal "clk" is delayed with respect to the first switching point of the replica data "rep-data1", the output "dif1" is always "1". Further, when the rising edge of the clock signal "clk" coincides with the first switching point of the replica data "rep-data1", the output "dif1" has both values "0" and "1".

The controller 1335 controls the phase of the replica clock signal "rep-clk1" output from the desired-phase generator 1331 on the basis of the output "dif1" output from the flip-flop 1334. For example, when the output "dif1" is "0", the controller 1335 controls the desired-phase generator 1331 to advance the phase of the replica clock signal "rep-clk1". When the output "dif1" is "1", the controller 1335 controls the desired-phase generator 1331 to delay the phase of the replica clock signal "rep-clk1".

The control of the controller 1335 allows convergence to the state where the first switching point of the replica data "rep-data1" coincides with the rising edge of the clock signal "clk". In this manner, the controller 1335 synchronizes the first switching point of the replica data "rep-data1" with the rising edge of the clock signal "clk".

Further, the controller 1335 generates a phase code "code1" indicating a first switching point of the replica data "rep-data1". For example, one period of the replica data "rep-data1" is divided into sections which are assigned different codes. The controller 1335 generates, as the phase code "code1", the code assigned to the section corresponding to the first switching point of the replica data "rep-data1". The controller 1335 outputs the generated phase code "code1" to the phase adjuster 1250.

The second detector 1240 includes a desired-phase generator 1341, a buffer 1342, a flip-flop (FF) 1343, a flip-flop (Ph-FF) 1344, and a controller 1345.

The desired-phase generator 1341 may be a phase interpolation circuit configured to generate a frequency-divided clock signal having a desired phase based on the multiphase frequency-divided clock signal "div-clk" having different phases output from the frequency divider 212. The desired-phase generator 1341 changes the phase of the frequency-divided clock signal to be generated under the control of the controller 1345. The desired-phase generator 1341 outputs the generated frequency-divided clock signal to the buffer 1342.

The buffer 1342 amplifies the frequency-divided clock signal output from the desired-phase generator 1341. The buffer 1342 outputs the amplified frequency-divided clock signal to the selector 1223 as the replica clock signal "rep-clk 2". The buffer 1342 may be, for example, a buffer having delay characteristics equivalent to those of the buffer 214.

The flip-flop 1343 synchronizes the replica data "rep-data2" output from the selector 1223 with a rising edge of the clock signal "clk" input through the input terminal 211. An output "ph2" of the flip-flop 1343 is output to the flip-flop 1344.

The flip-flop 1344 synchronizes the output "ph2" from the flip-flop 1343 with a rising edge of the frequency-divided clock signal "div-clk" output from the frequency divider 212. An output "dif2" of the flip-flop 1344 is output to the controller 1345.

An inverter 1345a is connected before the controller 1345, and the controller 1345 receives an inverted version of the output "dif2" output from the flip-flop 1344. The inverted output "dif2" received by the controller 1345 indicates the direction of a shift of a rising edge of the clock signal "clk" with respect to a second switching point (a switching point from "1" to "0") of the replica data "rep-data 2". For example, when the rising edge of the clock signal "clk" is advanced with respect to the second switching point of the replica data "rep-data2", the output "dif2" is always "1". When the rising edge of the clock signal "clk" is delayed with respect to the second switching point of the replica data "rep-data2", the output "dif2" is always "0". Further, when the rising edge of the clock signal "clk" coincides with the second switching point of the replica data "rep-data2", the output "dif2" has both values "0" and "1".

The controller 1345 controls the phase of the replica clock signal "rep-clk 2" output from the desired-phase generator 1341 on the basis of the output "dif2" output from the flip-flop 1344. For example, when the output "dif2" is "1", the controller 1345 controls the desired-phase generator 1341 to advance the phase of the replica clock signal "rep-clk2". When the output "dif2" is "0", the controller 1345 controls the desired-phase generator 1341 to delay the phase of the replica clock signal "rep-clk2".

The control of the controller 1345 allows convergence to the state where the second switching point of the replica data "rep-data2" coincides with the rising edge of the clock signal "clk". In this manner, the controller 1345 synchronizes the second switching point of the replica data "rep-data2" with the rising edge of the clock signal "clk".

Further, the controller 1345 generates a phase code "code2" indicating a second switching point of the replica data "rep-data2". For example, one period of the replica data "rep-data2" is divided into sections which are assigned different codes. Here, the assignment of the codes may be performed using a rule similar to that of the assignment of the codes by the controller 1335. The controller 1345 generates, as the phase code "code2", the code assigned to the section corresponding to the second switching point of the replica data "rep-data2". The controller 1345 outputs the generated phase code "code2" to the phase adjuster 1250.

The phase adjuster 1250 includes an intermediate phase generator 1351 and a desired-phase generator 1352. The intermediate phase generator 1351 generates an intermediate phase code "code3" indicating an intermediate phase between the phase indicated by the phase code "code1" output from the first detector 1230 and the phase indicated by the phase code "code2" output from the second detector 1240. The intermediate phase generator 1351 outputs the generated intermediate phase code "code3" to the desired-phase generator 1352.

The desired-phase generator 1352 may be a phase interpolation circuit configured to generate a clock signal "data-clk" having a desired phase based on the multiphase frequency-divided clock signal "div-clk" having different phases output from the frequency divider 212. The desired-phase generator 1352 controls the phase of the clock signal "data-clk" so as to become the phase indicated by the intermediate phase code "code3" output from the intermediate phase generator 1351.

FIG. 14A is a time chart (part 1) of the operation of the first detector 1230 illustrated in FIG. 13. In FIG. 14A, the horizontal axis represents time. FIG. 14A illustrates that rising edges of the clock signal "clk" are delayed with respect to first switching points of the replica data "rep-data1".

Reference numeral 1410 represents the replica clock signal "rep-clk1" input to the selector 1213. Reference numeral 1420 represents the replica data "rep-data1" input from the selector 1213 to the flip-flop 1333. The switching points of the replica data "rep-data1" are synchronous to those of the replica clock signal "rep-clk1". Reference numeral 1421 represents the first switching points of the replica data "rep-data1".

Reference numeral 1430 represents the clock signal "clk" input through the input terminal 211 to the flip-flop 1333. Here, the rising edges of the clock signal "clk" are delayed with respect to the first switching points (switching points from "0" to "1") of the replica data "rep-data1".

Reference numeral 1440 represents the output "ph1" of the flip-flop 1333. Reference numeral 1450 represents the frequency-divided clock signal "div-clk". Reference numeral 1460 represents the output "dif1" output from the flip-flop 1334 to the controller 1335. In this case, the output "dif1" is always "0" (all0).

Thus, the phase of the replica clock signal "rep-clk1" is delayed under the control of the controller 1335. Therefore, the phase of the replica data "rep-data 1" is delayed so that the rising edges of the clock signal "clk" may approach the first switching points of the replica data "rep-data1".

FIG. 14B is a time chart (part 2) of the operation of the first detector 1230 illustrated in FIG. 13. In FIG. 14B, portions similar to those illustrated in FIG. 14A are represented by the same reference numerals and descriptions thereof are omitted. FIG. 14B illustrates that the rising edges of the clock signal "clk" coincide with the first switching points of the replica data "rep-data1".

As represented by reference numeral 1430, the rising edges of the clock signal "clk" coincide with the first switching points of the replica data "rep-data1". In this case, the output "dif1" has values "0" and "1" (0 or 1). Thus, the phase of the replica clock signal "rep-clk1" is maintained under the control of the controller 1335. Therefore, the rising edges of the clock signal "clk" may be maintained to coincide with the first switching points of the replica data "rep-data1".

Figure 14C:
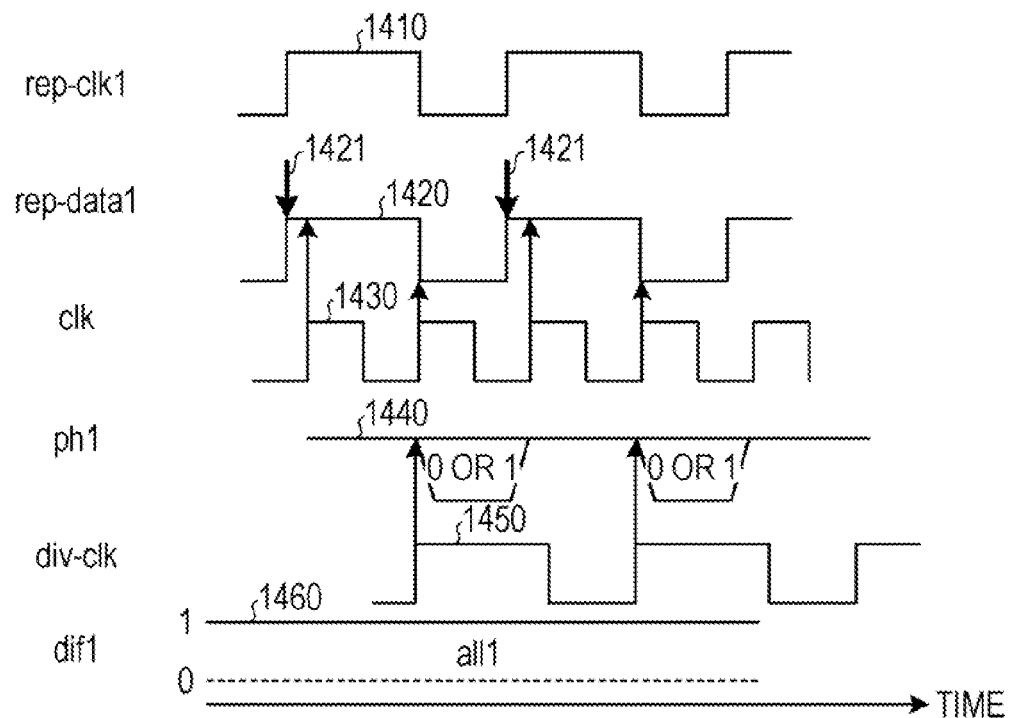

FIG. 14C is a time chart (part 3) of the operation of the first detector 1230 illustrated in FIG. 13. In FIG. 14C, portions similar to those illustrated in FIG. 14A are represented by the same reference numerals and descriptions thereof are omitted. FIG. 14C illustrates that the rising edges of the clock signal "clk" are advanced with respect to the first switching points of the replica data "rep-data1".

As represented by reference numeral 1430, the rising edges of the clock signal "clk" are advanced with respect to the first switching points of the replica data "rep-data1". In this case, the output "dif1" is always "1" (all1). Thus, the phase of the replica clock signal "rep-clk1" is advanced under the control of the controller 1335. Therefore, the phase of the replica data "rep-data1" is advanced so that the rising edges of the clock signal "clk" may approach the first switching points of the replica data "rep-data1".

Figure 15A:
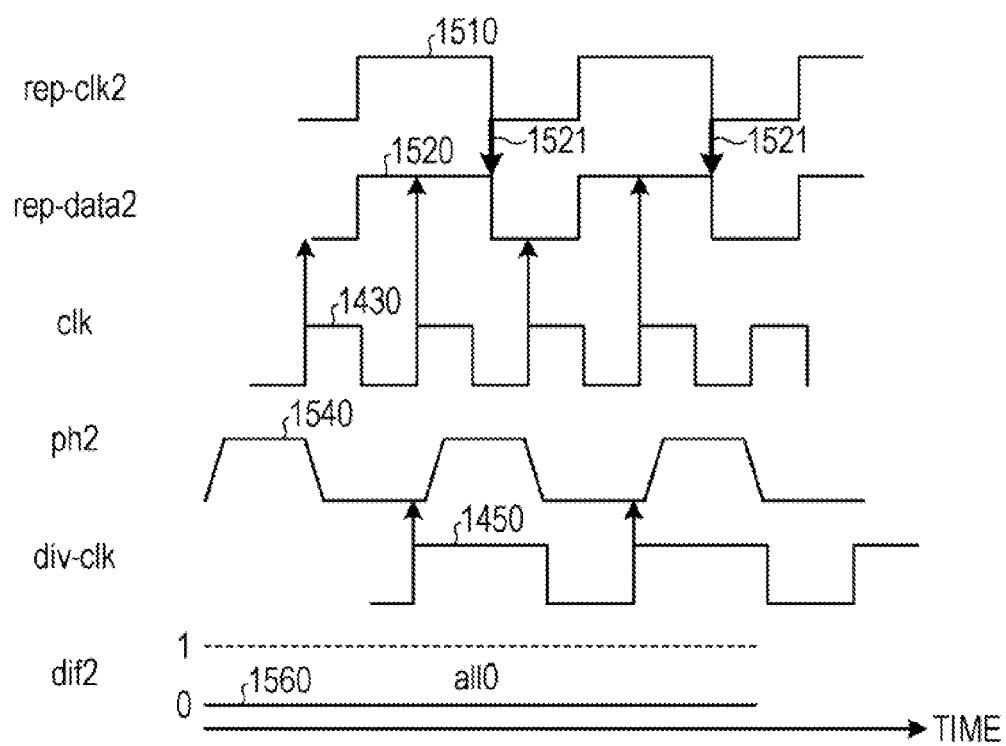
FIG. 15A to FIG. 15C are time charts of the operation of a second detector illustrated in FIG. 13.

FIG. 15A is a time chart (part 1) of the operation of the second detector 1240 illustrated in FIG. 13. In FIG. 15A, portions similar to those illustrated in FIG. 14A are represented by the same reference numerals and descriptions thereof are omitted. FIG. 15A illustrates that rising edges of the clock signal "clk" are delayed with respect to second switching points of the replica data "rep-data2".

Reference numeral 1510 represents the replica clock signal "rep-clk2" input to the selector 1223. Reference numeral 1520 represents the replica data "rep-data2" input from the selector 1223 to the flip-flop 1343. The switching points of the replica data "rep-data2" are synchronous to those of the replica clock signal "rep-clk2". Reference numeral 1521 represents the second switching points of the replica data "rep-data2".

Here, the rising edges of the clock signal "clk" are delayed with respect to the second switching points (switching points from "1" to "0") of the replica data "rep-data2". Reference numeral 1540 represents the output "ph2" of the flip-flop 1343. Reference numeral 1560 represents the output "dif2" output from the flip-flop 1344 to the controller 1345. In this case, the output "dif2" is always "0".

Thus, the phase of the replica clock signal "rep-clk2" is delayed under the control of the controller 1345. Therefore, the phase of the replica data "rep-data 2" is delayed so that the rising edges of the clock signal "clk" may approach the second switching points of the replica data "rep-data2".

Figure 15B:
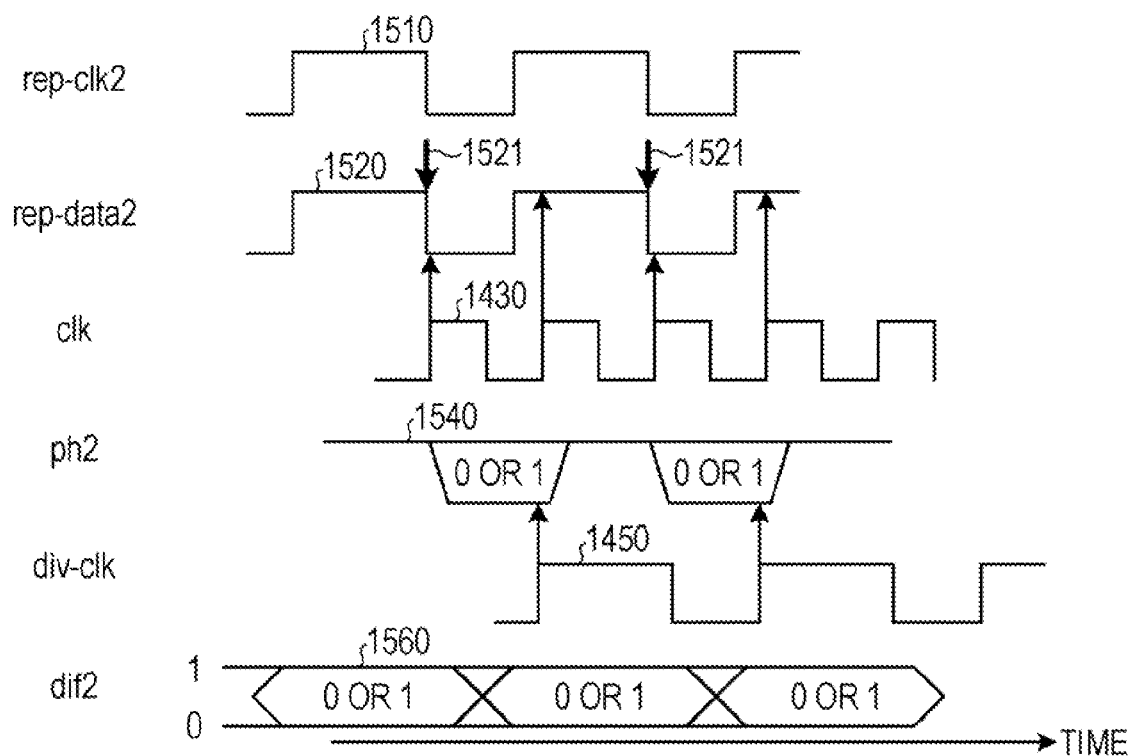

FIG. 15B is a time chart (part 2) of the operation of the second detector 1240 illustrated in FIG. 13. In FIG. 15B, portions similar to those illustrated in FIG. 15A are represented by the same reference numerals and descriptions thereof are omitted. FIG. 15B illustrates that the rising edges of the clock signal "clk" coincide with the second switching points of the replica data "rep-data2".

As represented by reference numeral 1430, the rising edges of the clock signal "clk" coincide with the second switching points of the replica data "rep-data 2". In this case, the output "dif2" has both values "0" and "1" (0 or 1). Thus, the phase of the replica clock signal "rep-clk2" is maintained under the control of the controller 1345. Therefore, the rising edges of the clock signal "clk" may be maintained to coincide with the second switching points of the replica data "rep-data2".

Figure 15C:
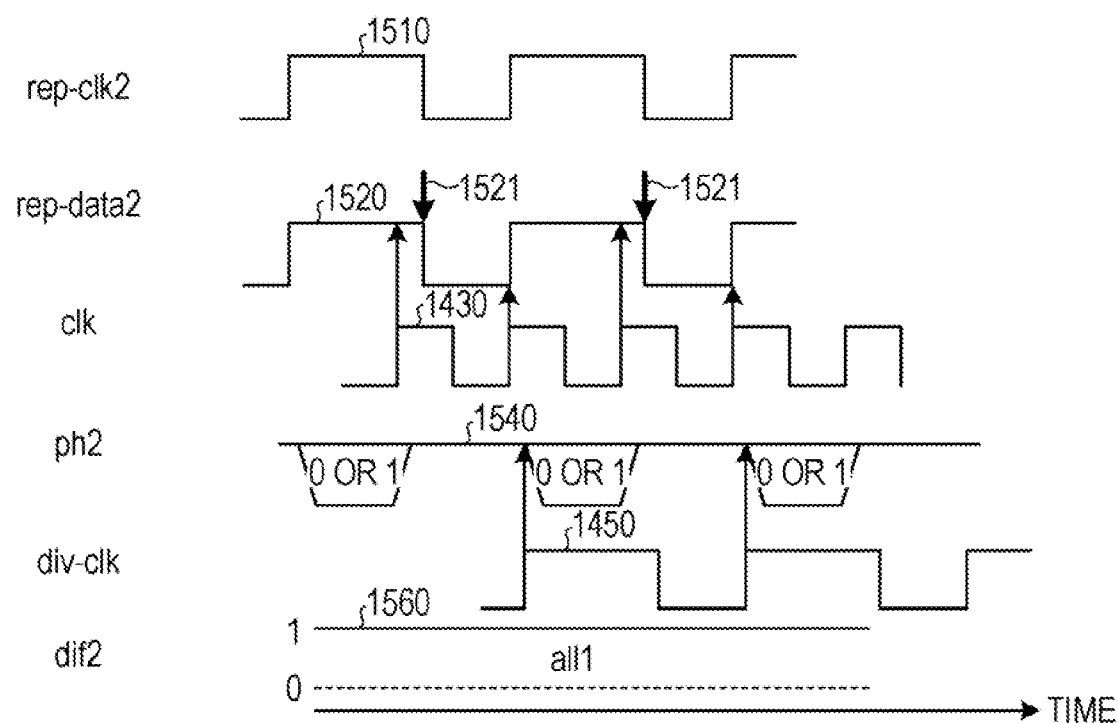

FIG. 15C is a time chart (part 3) of the operation of the second detector 1240 illustrated in FIG. 13. In FIG. 15C, portions similar to those illustrated in FIG. 15A are represented by the same reference numerals and descriptions thereof are omitted. FIG. 15C illustrates that the rising edges of the clock signal "clk" are advanced with respect to the second switching points of the replica data "rep-data2".

As represented by reference numeral 1430, the rising edges of the clock signal "clk" are advanced with respect to the second switching points of the replica data "rep-data2". In this case, the output "dif2" is always "1". Thus, the phase of the replica clock signal "rep-clk2" is advanced under the control of the controller 1345. Therefore, the phase of the replica data "rep-data2" is advanced so that the rising edges of the clock signal "clk" may approach the second switching points of the replica data "rep-data2".

Figure 16:
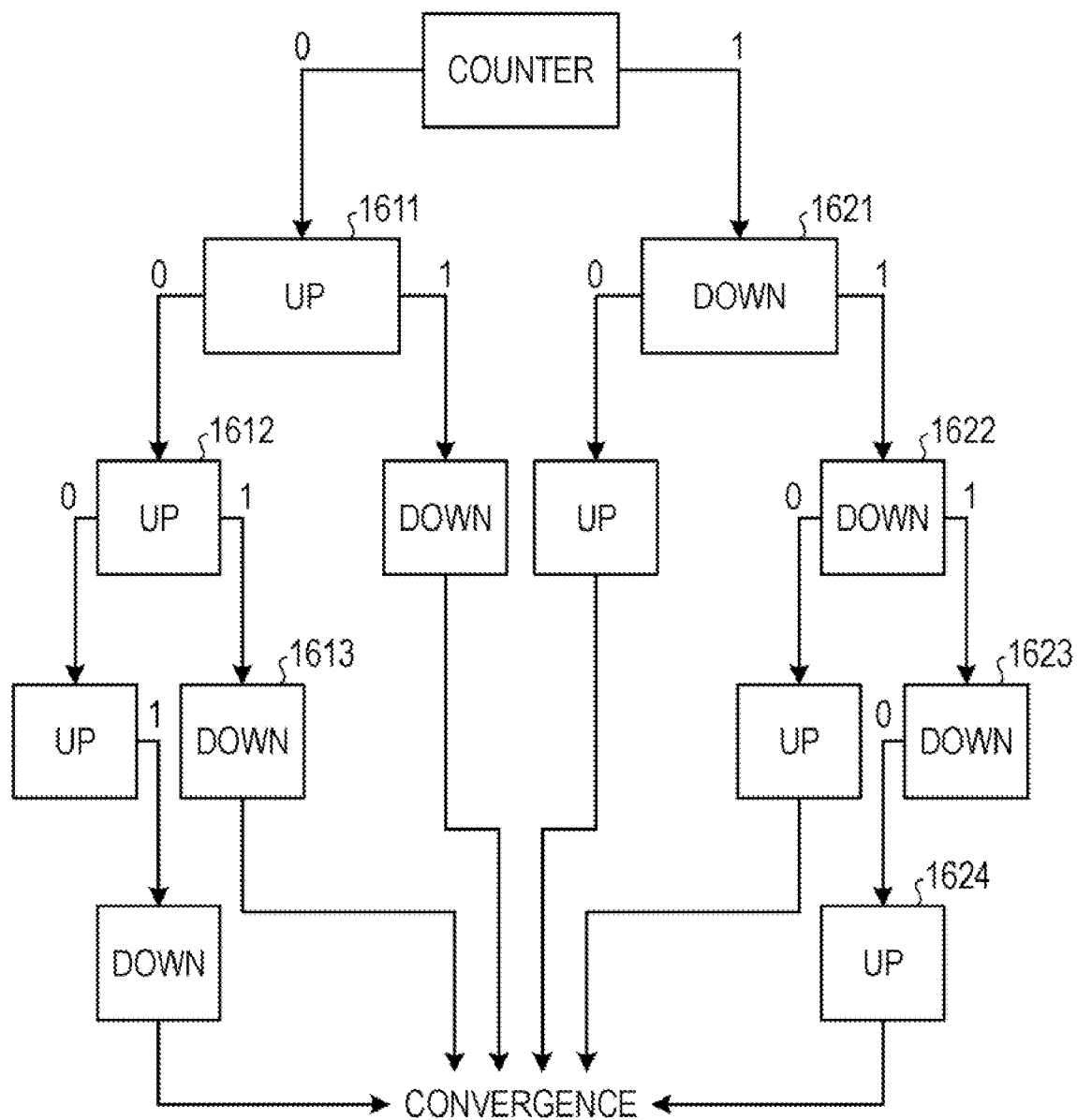
FIG. 16 is a diagram illustrating an example of the operation of a controller of the first detector illustrated in FIG. 13.

FIG. 16 is a diagram illustrating an example of the operation of the controller 1335 of the first detector 1230 illustrated in FIG. 13. In FIG. 16, values "0" and "1" represent the values of the output "dif1" input from the flip-flop 1334 to the controller 1335. The controller 1335 includes a counter. When the output "dif1" is "0", the value of the counter is increased ("up") whereas when the output "dif1" is "1", the value of the counter is decreased ("down").

When the value of the output "dif1" changes, the controller 1335 determines that the first switching points of the replica data "rep-data1" converge to the rising edges of the clock signal "clk", and maintains the value of the counter. The desired-phase generator 1331 changes the phase of the replica clock signal "rep-clk1" in accordance with the value of the counter of the controller 1335. For example, when the value of the output "dif1" changes in the order of "0", "0", and "1" (reference numerals 1611 to 1613), the controller 1335 provides convergence by incrementing the counter twice and then decrementing the counter once. When the value of the output "dif1" changes in the order of "1", "1", "1", and "0" (reference numerals 1621 to 1624), the controller 1335 provides convergence by decrementing the counter three times and then incrementing the counter once.

Figure 17:
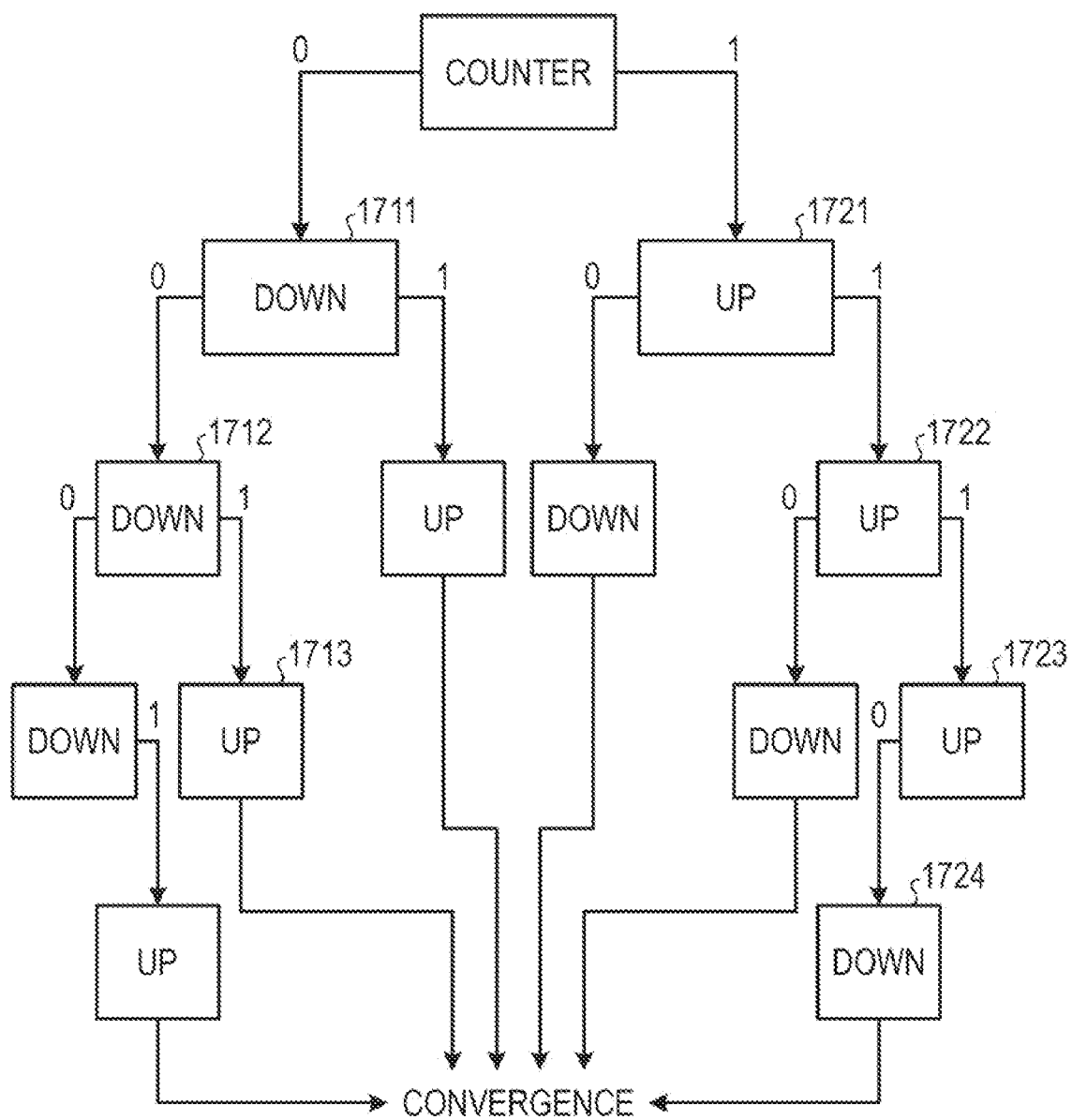
FIG. 17 is a diagram illustrating an example of the operation of a controller of the second detector illustrated in FIG. 13.

FIG. 17 is a diagram illustrating an example of the operation of the controller 1345 of the second detector 1240 illustrated in FIG. 13. In FIG. 17, values "0" and "1" represent the values of the output "dif2" input from the flip-flop 1344 to the controller 1345. The controller 1345 includes a counter. When the output "dif2" is "0", the value of the counter is decreased ("down") whereas when the output "dif2" is "1", the value of the counter is increased ("up").

When the value of the output "dif2" to be input to the controller 1345 changes, the controller 1345 determines that the second switching points of the replica data "rep-data2" converge to the rising edges of the clock signal "clk", and maintains the value of the counter. The controller 1345 outputs the value of the counter to the desired-phase generator 1341. The desired-phase generator 1341 changes the phase of the replica clock signal "rep-clk2" in accordance with the value of the counter of the controller 1345. For example, when the value of the output "dif2" changes in the order of "0", "0", and "1" (reference numerals 1711 to 1713), the controller 1345 provides convergence by decrementing the counter twice and then incrementing the counter once. When the value of the output "dif2" changes in the order of "1", "1", "1", and "0" (reference numerals 1721 to 1724), the controller 1345 provides convergence by incrementing the counter three times and then decrementing the counter once.

Figure 18:
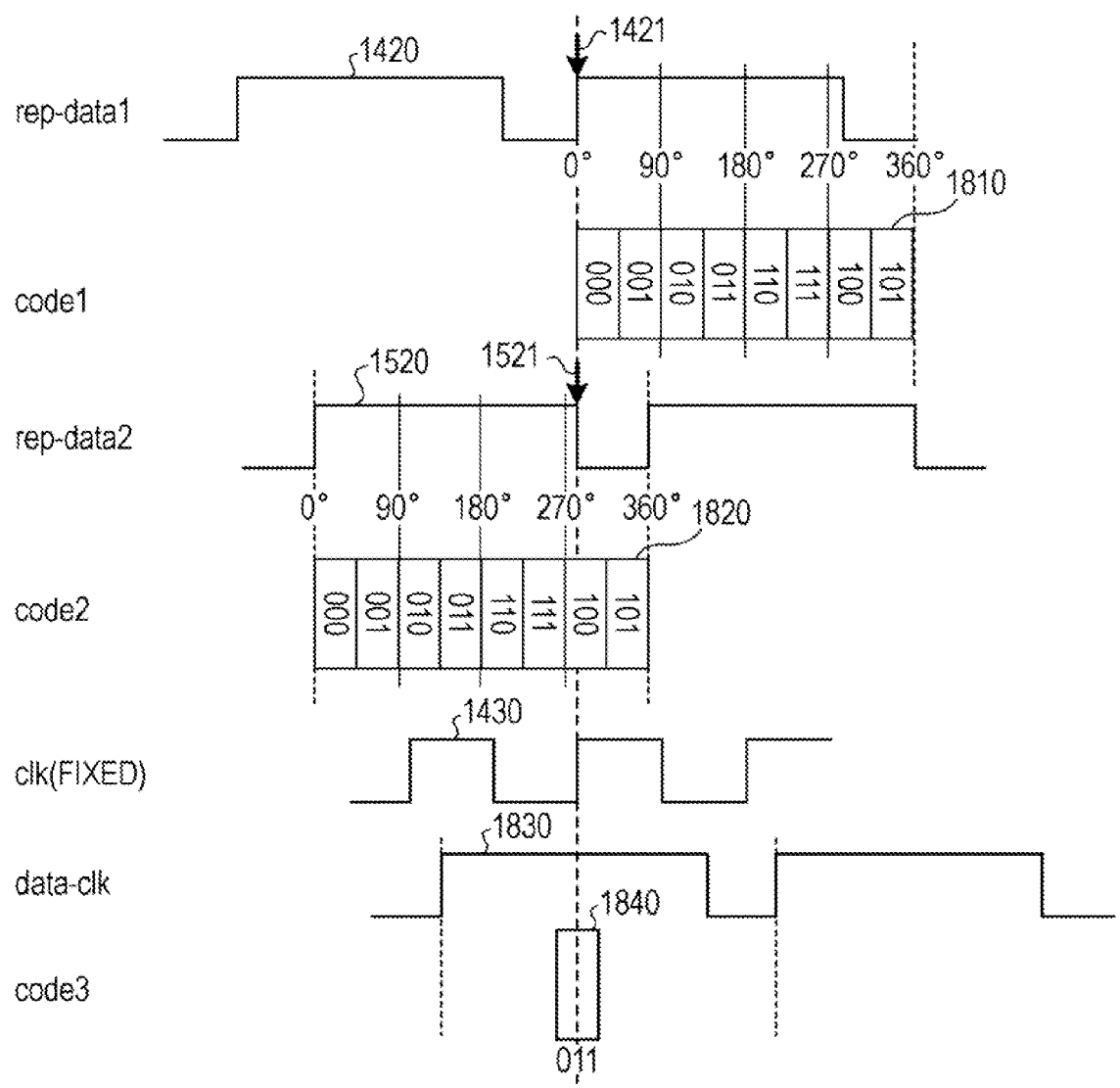
FIG. 18 is a diagram illustrating an example of the operation of a phase adjuster illustrated in FIG. 13.

FIG. 18 is a diagram illustrating an example of the operation of the phase adjuster 1250 illustrated in FIG. 13. In FIG. 18, portions similar to those illustrated in FIGS. 14A to 14C and FIGS. 15A to 15C are represented by the same reference numerals and descriptions thereof are omitted. Reference numeral 1810 represents the phase code "code1" input to the phase adjuster 1250, and reference numeral 1820 represents the phase code "code2" input to the phase adjuster 1250. It is assumed here that one period of the replica data "rep-data1" is divided into eight sections which are assigned codes "000", "001", "010", "011", "110", "111", "100", and "101". In this case, one period of the replica data "rep-data 2" is also divided into eight sections which are assigned codes "000", "001", "010", "011", "110", "111", "100", and "101".

The phase code "code1" may be the code "000" indicating that a first switching point of the replica data "rep-data1" represented by reference numeral 1420 has a phase of 0°. The phase code "code2" may be the code "100" indicating that a second switching point of the replica data "rep-data2" represented by reference numeral 1520 has a phase of 270°.

Reference numeral 1830 represents the clock signal "data-clk" generated by the desired-phase generator 1352. Reference numeral 1840 represents the intermediate phase code "code3" output from the intermediate phase generator 1351 to the desired-phase generator 1352. The intermediate phase code "code3" may be the code "011" indicating an intermediate phase of 135° between 0° indicated by the phase code "code1" and 270° indicated by the phase code "code2".

The desired-phase generator 1352 adjusts the phase of the clock signal "data-clk" so as to be equal to 135° indicated by the intermediate phase code "code3". In this manner, the phase of the clock signal "data-clk" is controlled so as to become an intermediate phase between the first rising point of the replica data "rep-data1" and the second rising point of the replica data "rep-data2".

Figure 19:
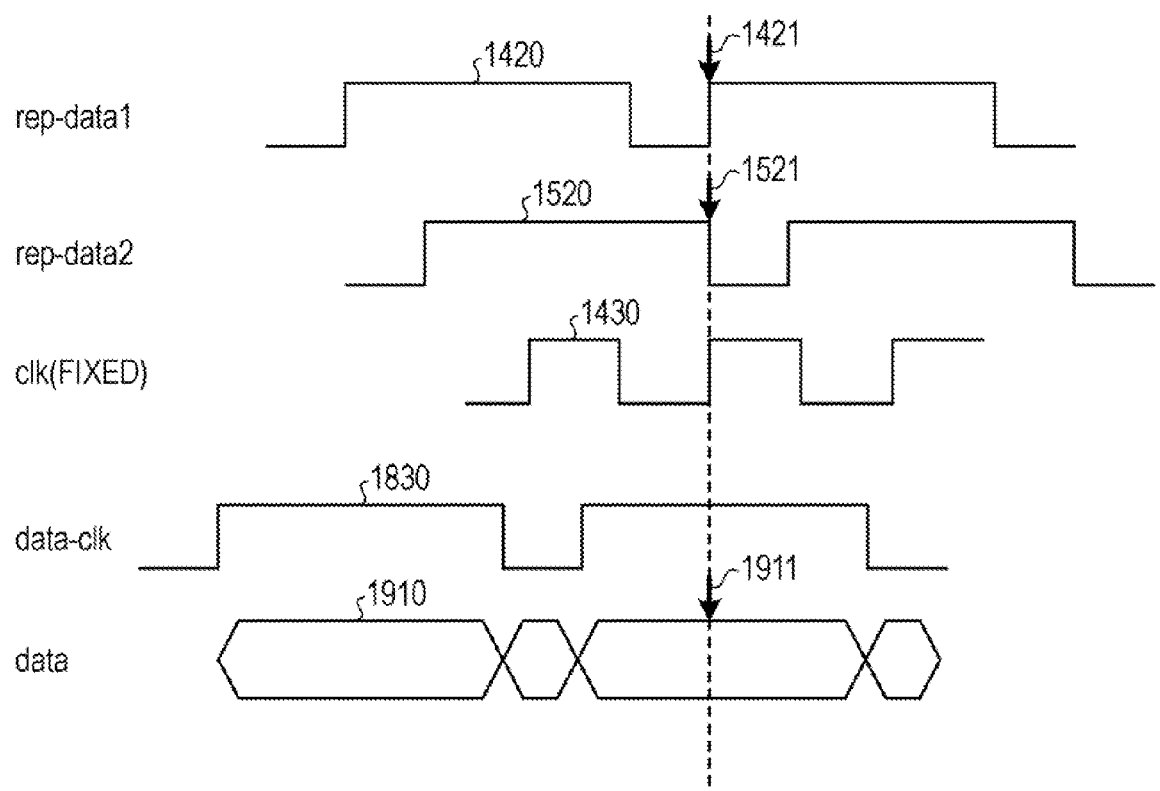
FIG. 19 is a diagram illustrating a control result of the parallel-serial converter illustrated in FIG. 13.

FIG. 19 is a diagram illustrating a control result of the parallel-serial converter 200 illustrated in FIG. 13. In FIG. 19, portions similar to those illustrated in FIG. 18 are represented by the same reference numerals and descriptions thereof are omitted. Reference numeral 1910 represents the data "data" input to the flip-flop 240. In the data "data", data items are switched in synchronization with the clock signal "data-clk". Therefore, an optimum point 1911 (an intermediate point between switching points) of the data "data" may be synchronized with a rising edge of the clock signal "clk". Thus, the flip-flop 240 shapes the data "data" using the optimum point 1911. The data "data" may accurately be shaped.

Figure 20:
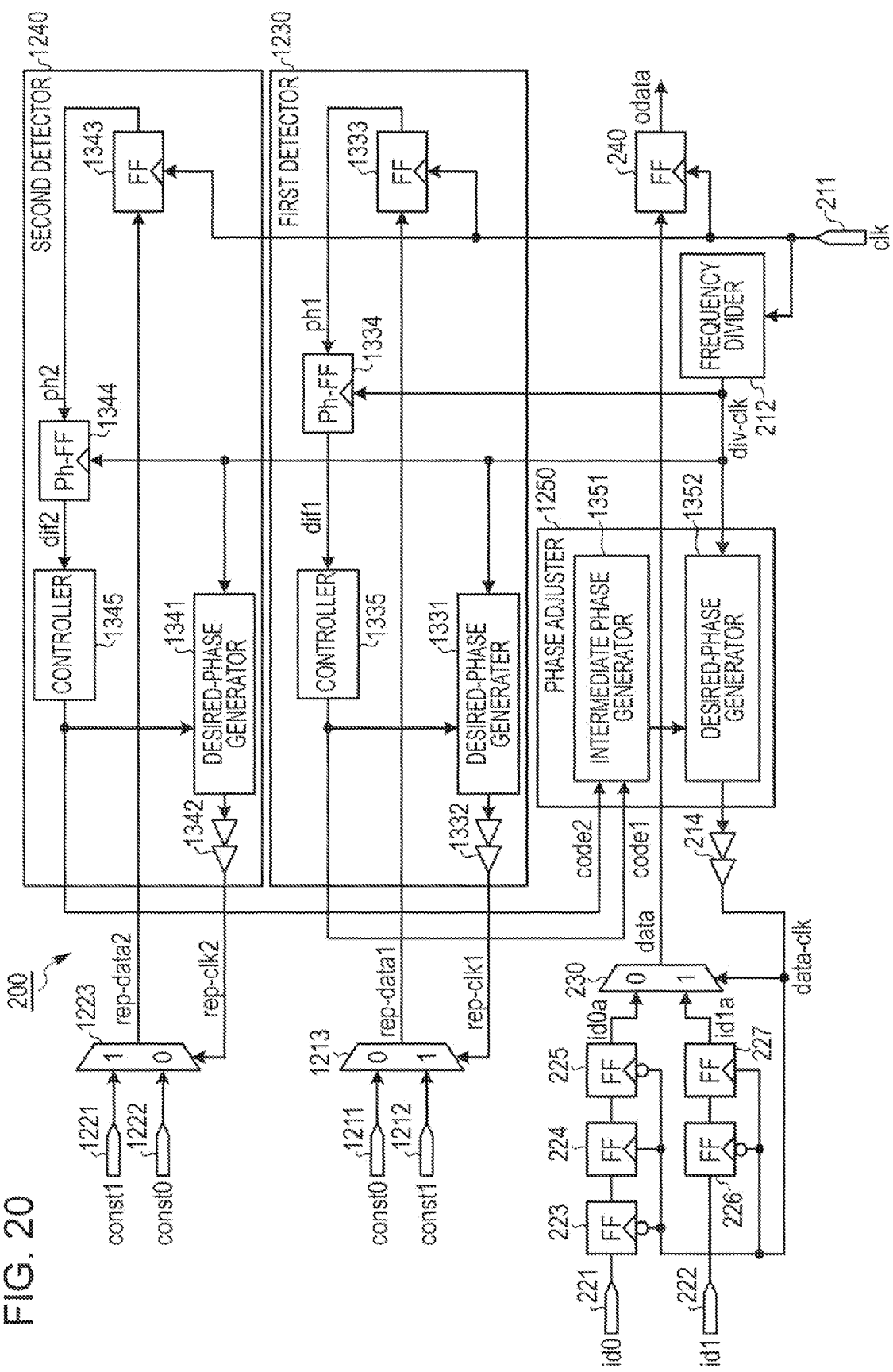
FIG. 20 is a diagram illustrating an exemplary modification of the parallel-serial converter illustrated in FIG. 13.

FIG. 20 is a diagram illustrating an exemplary modification of the parallel-serial converter 200 illustrated in FIG. 13. In FIG. 20, elements similar to those illustrated in FIG. 13 are represented by the same reference numerals and descriptions thereof are omitted. Fixed data "1" (const1) is input to the input terminal 1221. The input fixed data "1" input through the input terminal 1221 is input to the selector 1223. Fixed data "0" (const0) is input to the input terminal 1222. The input fixed data "0" input through the input terminal 1222 is input to the selector 1223.

The controller 1345 receives the output "dif2" output from the flip-flop 1344 without the output "dif2" being inverted. The output "dif2" received by the controller 1345 indicates a shift of a rising edge of the clock signal "clk" with respect to a second switching point (a switching point from "1" to "0") of the replica data "rep-data2".

As in the exemplary modification illustrated in FIG. 20, since the fixed data inputs to the input terminals 1221 and 1222 are inverted, even a configuration in which the controller 1345 receives the output "dif2" without the output "dif2" being inverted may achieve results equivalent to those of the configuration illustrated in FIG. 13.

In this manner, the parallel-serial converter 200 according to the fourth embodiment performs timing control based on an intermediate phase between a first switching point and a second switching point of the replica data items. Therefore, even when the duty ratio of the data "data" is not 50%, the rising time of the clock signal "clk" with respective to the data "data may be controlled as desired, and the data "data" may accurately be shaped. In addition, since timing control is performed by adjusting the phase of the clock signal "data-clk", the control may be performed at the frequency of the frequency-divided clock signal "div-clk" obtained by the frequency divider 212. Therefore, timing control may be stably and accurately performed.

Fifth Embodiment

Figure 21:
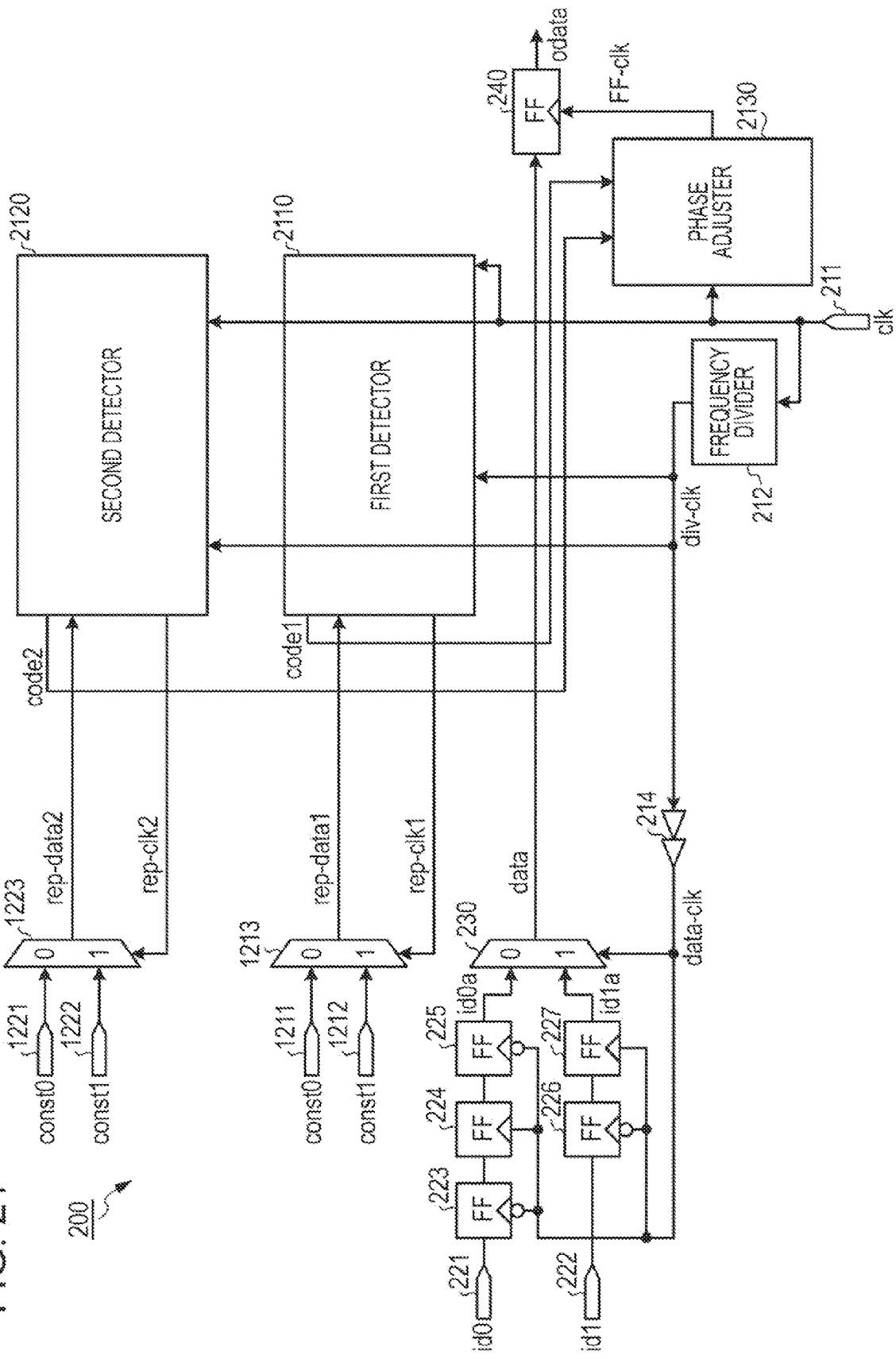
FIG. 21 is a diagram illustrating the configuration of a parallel-serial converter according to a fifth embodiment.

FIG. 21 is a diagram illustrating the configuration of a parallel-serial converter according to a fifth embodiment. In FIG. 21, elements similar to those illustrated in FIG. 12 are represented by the same reference numerals and descriptions thereof are omitted. As illustrated in FIG. 21, a parallel-serial converter 200 according to the fifth embodiment includes an input terminal 211, a frequency divider 212, a buffer 214, input terminals 221 and 222, flip-flops 223 to 227, a selector 230, a flip-flop 240, input terminals 1211 and 1212, a selector 1213, input terminals 1221 and 1222, a selector 1223, a first detector 2110, a second detector 2120, and a phase adjuster 2130.

An input clock signal "clk" input through the input terminal 211 is input to the frequency divider 212, the first detector 2110, the second detector 2120, and the phase adjuster 2130. The frequency divider 212 outputs a generated frequency-divided clock signal "div-clk" to the buffer 214, the first detector 2110, and the second detector 2120. The buffer 214 amplifies the frequency-divided clock signal "div-clk" output from the frequency divider 212. The buffer 214 outputs the amplified frequency-divided clock signal "div-clk" to the selector 230 and the flip-flops 223 to 227 as a clock signal "data-clk".

The first detector 2110 detects a first switching point of replica data "rep-data1" output from the selector 1213. Further, the first detector 2110 generates a phase code "code1" indicating the detected first switching point of the replica data "rep-data1", and outputs the generated phase code "code1" to the phase adjuster 2130.

The second detector 2120 detects a second switching point of replica data "rep-data2" output from the selector 1223. Further, the second detector 2120 generates a phase code "code2" indicating the detected second switching point of the replica data "rep-data2", and outputs the generated phase code "code2" to the phase adjuster 2130.

The phase adjuster 2130 adjusts the phase of the clock signal "clk" input through the input terminal 211 on the basis of the phase indicated by the phase code "code1" output from the first detector 2110 and the phase indicated by the phase code "code2" output from the second detector 2120. Specifically, the phase adjuster 2130 adjusts the phase of the clock signal "clk" so as to become an intermediate phase between the phase indicated by the phase code "code1" and the phase indicated by the phase code "code2".

The phase adjuster 2130 outputs the clock signal "clk" whose phase has been adjusted to the flip-flop 240 as a clock signal "FF-clk". The flip-flop 240 synchronizes the data "data" output from the selector 230 with a rising edge of the clock signal "FF-clk".

Figure 22:
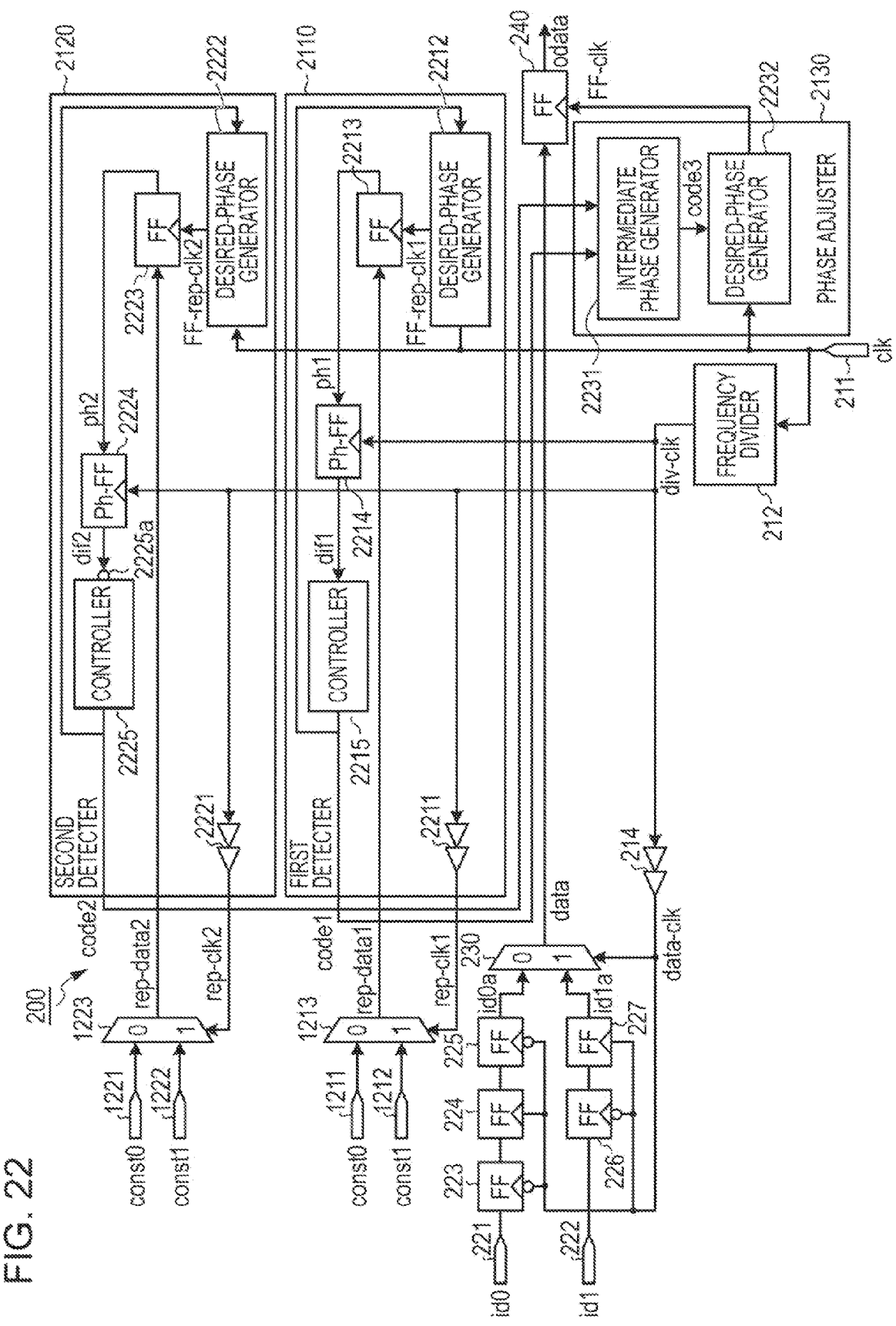
FIG. 22 is a diagram illustrating a specific example of the parallel-serial converter illustrated in FIG. 21.

FIG. 22 is a diagram illustrating a specific example of the parallel-serial converter 200 illustrated in FIG. 21. In FIG. 22, elements similar to those illustrated in FIG. 21 are represented by the same reference numerals and descriptions thereof are omitted. As illustrated in FIG. 22, the first detector 2110 includes a buffer 2211, a desired-phase generator 2212, a flip-flop (FF) 2213, a flip-flop (Ph-FF) 2214, and a controller 2215.

The buffer 2211 amplifies the frequency-divided clock signal "div-clk" output from the frequency divider 212. The buffer 2211 outputs the amplified frequency-divided clock signal "div-clk" to the selector 1213 as a replica clock signal "rep-clk1". The buffer 2211 may be, for example, a buffer having delay characteristics equivalent to those of the buffer 214. In this manner, the frequency-divided clock signal "div-clk" to be supplied to the selector 230 as the clock signal "data-clk" is supplied to the selector 1213 as the replica clock signal "rep-clk1". Thus, the value of the replica data "rep-data1" may be switched in synchronization with the switching of parallel data by the selector 230.

The desired-phase generator 2212 may be a phase interpolation circuit configured to generate a frequency-divided clock signal having a desired phase based on the multiphase clock signal "clk" having different phases output from the input terminal 211. The desired-phase generator 2212 changes the phase of the clock signal to be generated under the control of the controller 2215. The desired-phase generator 2212 outputs the generated clock signal to the flip-flop 2213 as a replica clock signal "FF-rep-clk1".

The flip-flop 2213 synchronizes the replica data "rep-data1" output from the selector 1213 with a rising edge of the replica clock signal "FF-rep-clk1" output from the desired-phase generator 2212. An output "ph1" of the flip-flop 2213 is output to the flip-flop 2214.

The flip-flop 2214 synchronizes the output "ph1" from the flip-flop 2213 with a rising edge of the frequency-divided clock signal "div-clk" output from the frequency divider 212. An output "dif1" of the flip-flop 2214 is output to the controller 2215.

The output "dif1" output from the flip-flop 2214 indicates a shift of a rising edge of the replica clock signal "FF-rep-clk1" with respect to a first switching point (a switching point from "0" to "1") of the replica data "rep-data1". For example, when the rising edge of the replica clock signal "FF-rep-clk1" is advanced with respect to the first switching point of the replica data "rep-data 1", the output "dif1" is always "0". When the rising edge of the replica clock signal "FF-rep-clk1" is delayed with respect to the first switching point of the replica data "rep-data1", the output "dif1" is always "1". Further, when the rising edge of the replica clock signal "FF-rep-clk1" coincides with the first switching point of the replica data "rep-data 1", the output "dif1" has both values "0" and "1".

The controller 2215 controls the phase of the replica clock signal "FF-rep-clk 1" output from the desired-phase generator 2212 on the basis of the output "dif1" output from the flip-flop 2214. For example, when the output "dif1" is "0", the controller 2215 controls the desired-phase generator 2212 to advance the phase of the replica clock signal "FF-rep-clk1". When the output "dif1" is "1", the controller 2215 controls the desired-phase generator 2212 to delay the phase of the replica clock signal "FF-rep-clk1".

The control of the controller 2215 allows convergence to the state where the first switching point of the replica data "rep-data1" coincides with the rising edge of the replica clock signal "FF-rep-clk1". In this manner, the controller 2215 synchronizes the first switching point of the replica data "rep-data1" with the rising edge of the replica clock signal "FF-rep-clk1".

Further, the controller 2215 generates a phase code "code1" indicating the first switching point of the replica data "rep-data1". For example, one period of the replica data "rep-data1" is divided into sections which are assigned different codes. The controller 2215 generates, as the phase code "code1", the code assigned to the section corresponding to the first switching point of the replica data "rep-data1". The controller 2215 outputs the generated phase code "code1" to the phase adjuster 2130.

The second detector 2120 includes a buffer 2221, a desired-phase generator 2222, a flip-flop (FF) 2223, a flip-flop (Ph-FF) 2224, and a controller 2225.

The buffer 2221 amplifies the frequency-divided clock signal "div-clk" output from the frequency divider 212. The buffer 2221 outputs the amplified frequency-divided clock signal "div-clk" to the selector 1223 as a replica clock signal "rep-clk2". The buffer 2221 may be, for example, a buffer having delay characteristics equivalent to those of the buffer 214.

The desired-phase generator 2222 may be a phase interpolation circuit configured to generate a frequency-divided clock signal having a desired phase based on the multiphase clock signal "clk" having different phases output from the input terminal 211. The desired-phase generator 2222 changes the phase of the clock signal to be generated under the control of the controller 2225. The desired-phase generator 2222 outputs the generated clock signal to the flip-flop 2223 as a replica clock signal "FF-rep-clk2".

The flip-flop 2223 synchronizes the replica data "rep-data2" output from the selector 1223 with a rising edge of the replica clock signal "FF-rep-clk2" output from the desired-phase generator 2222. An output "ph2" of the flip-flop 2223 is output to the flip-flop 2224.

The flip-flop 2224 synchronizes the output "ph2" from the flip-flop 2223 with a rising edge of the frequency-divided clock signal "div-clk" output from the frequency divider 212. An output "dif2" of the flip-flop 2224 is output to the controller 2225.

An inverter 2225a is connected before the controller 2225, and the controller 2225 receives an inverted version of the output "dif2" output from the flip-flop 2224. The inverted output "dif2" received by the controller 2225 indicates a shift of a rising edge of the replica clock signal "FF-rep-clk2" with respect to a second switching point (a switching point from "1" to "0") of the replica data "rep-data 2". For example, when the rising edge of the replica clock signal "FF-rep-clk2" is advanced with respect to the second switching point of the replica data "rep-data 2", the output "dif2" is always "0". When the rising edge of the replica clock signal "FF-rep-clk2" is delayed with respect to the second switching point of the replica data "rep-data2", the output "dif2" is always "1". Further, when the rising edge of the replica clock signal "FF-rep-clk2" coincides with the second switching point of the replica data "rep-data2", the output "dif2" has both values "0" and "1".

The controller 2225 controls the phase of the replica clock signal "FF-rep-clk 2" output from the desired-phase generator 2222 on the basis of the output "dif2" output from the flip-flop 2224. For example, when the output "dif2" is "0", the controller 2225 controls the desired-phase generator 2222 to advance the phase of the replica clock signal "FF-rep-clk2". When the output "dif2" is "1", the controller 2225 controls the desired-phase generator 2222 to delay the phase of the replica clock signal "FF-rep-clk2".

The control of the controller 2225 allows convergence to the state where the second switching point of the replica data "rep-data2" coincides with the rising edge of the replica clock signal "FF-rep-clk2". In this manner, the controller 2225 synchronizes the second switching points of the replica data "rep-data2" with the rising edge of the replica clock signal "FF-rep-clk2".

Further, the controller 2225 generates a phase code "code2" indicating the second switching point of the replica data "rep-data2". For example, one period of the replica data "rep-data2" is divided into sections which are assigned different codes. Here, the assignment of the codes may be performed using a rule similar to that of the assignment of the codes by the controller 2215. The controller 2225 generates, as the phase code "code2", the code assigned to the section corresponding to the second switching point of the replica data "rep-data2". The controller 2225 outputs the generated phase code "code2" to the phase adjuster 2130.

The phase adjuster 2130 includes an intermediate phase generator 2231 and a desired-phase generator 2232. The intermediate phase generator 2231 generates an intermediate phase code "code3" indicating an intermediate phase between the phase indicated by the phase code "code1" output from the first detector 2110 and the phase indicated by the phase code "code2" output from the second detector 2120. The intermediate phase generator 2231 outputs the generated intermediate phase code "code3" to the desired-phase generator 2232.

The desired-phase generator 2232 may be a phase interpolation circuit configured to generate a clock signal "FF-clk" having a desired phase based on the multiphase clock signal "clk" having different phases output from the input terminal 211. The desired-phase generator 2232 controls the phase of the clock signal "FF-clk" to be generated on the basis of the intermediate phase indicated by the intermediate phase code "code3" output from the intermediate phase generator 2231. Specifically, the desired-phase generator 2232 controls the phase of the clock signal "FF-clk" so as to become the phase indicated by the intermediate phase code "code3".

Figure 23:
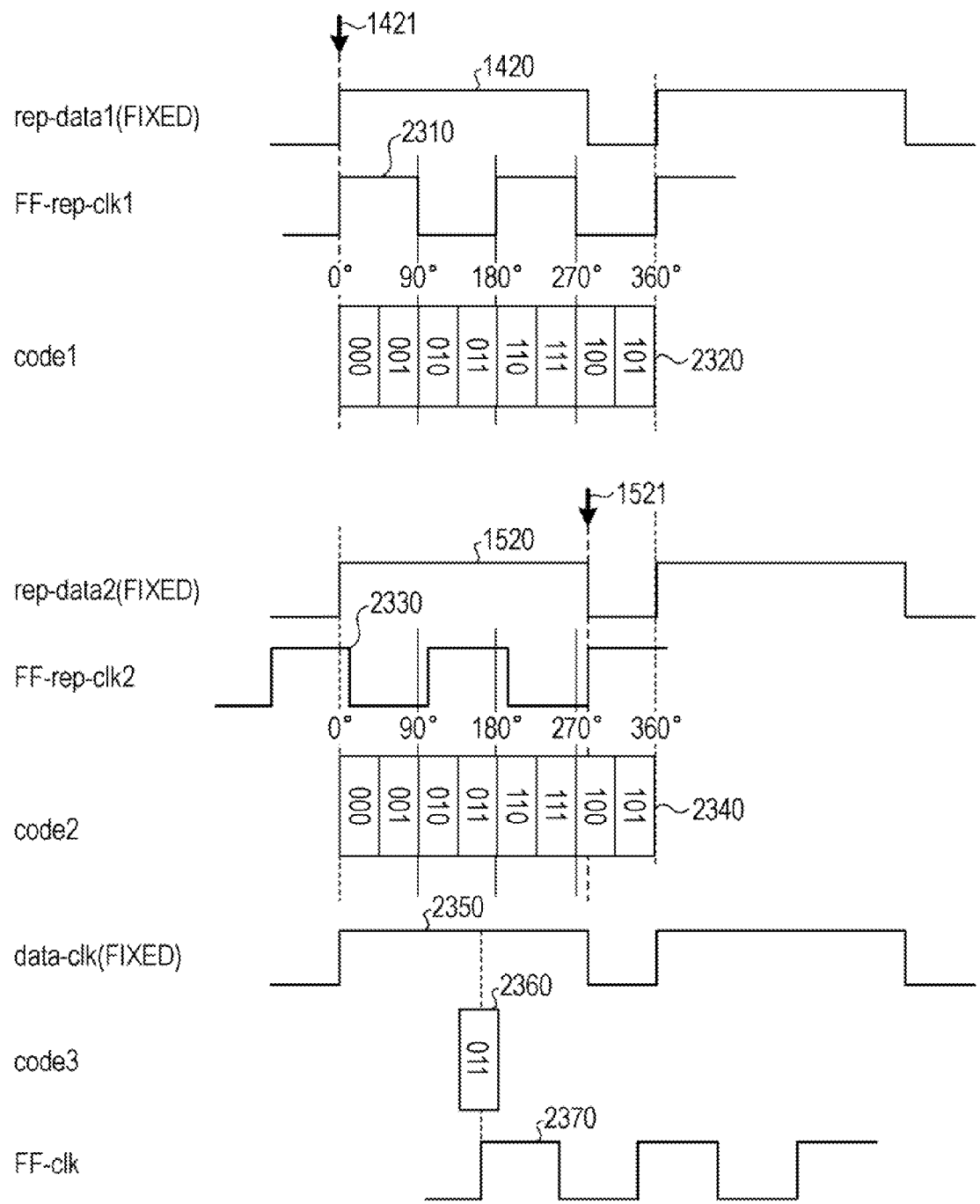
FIG. 23 is a diagram illustrating an example of the operation of a phase adjuster illustrated in FIG. 22.

FIG. 23 is a diagram illustrating an example of the operation of the phase adjuster 2130 illustrated in FIG. 22. In FIG. 23, portions similar to those illustrated in FIG. 18 are represented by the same reference numerals and descriptions thereof are omitted. Reference numeral 2310 represents the replica clock signal "FF-rep-clk1" input to the flip-flop 2213. Under the control of the controller 2215, a rising edge of the replica clock signal "FF-rep-clk1" is synchronous to a first switching point (reference numeral 1421) of the replica data "rep-data1". Reference numeral 2320 represents the phase code "code1" input from the first detector 2110 to the phase adjuster 2130.

Reference numeral 2330 represents the replica clock signal "FF-rep-clk2" input to the flip-flop 2223. Under the control of the controller 2225, a rising edge of the replica clock signal "FF-rep-clk2" is synchronous to a second switching point (reference numeral 1521) of the replica data "rep-data2". Reference numeral 2340 represents the phase code "code2" input from the second detector 2120 to the phase adjuster 2130.

It is assumed here that one period of the replica data "rep-data1" is divided into eight sections which are assigned codes "000", "001", "010", "011", "110", "111", "100", and "101". In this case, one period of the replica data "rep-data 2" is also divided into eight sections which are assigned codes "000", "001", "010", "011", "110", "111", "100", and "101".

The phase code "code1" may be the code "000" indicating that the first switching point of the replica data "rep-data1" has a phase of 0°. The phase code "code2" may be the code "100" indicating that the second switching point of the replica data "rep-data2" represented by reference numeral 1520 has a phase of 270°.

Reference numeral 2350 represents the clock signal "data-clk" input to the selector 230. Reference numeral 2360 represents the intermediate phase code "code3" output from the intermediate phase generator 2231 to the desired-phase generator 2232. Reference numeral 2370 represents the clock signal "FF-clk" input to the flip-flop 240. The intermediate phase code "code3" may be the code "011" indicating an intermediate phase of 135° between 0° indicated by the phase code "code1" and 270° indicated by the phase code "code2". Thus, the desired-phase generator 2232 adjusts the phase of the clock signal "FF-clk" to 135°.

Figure 24:
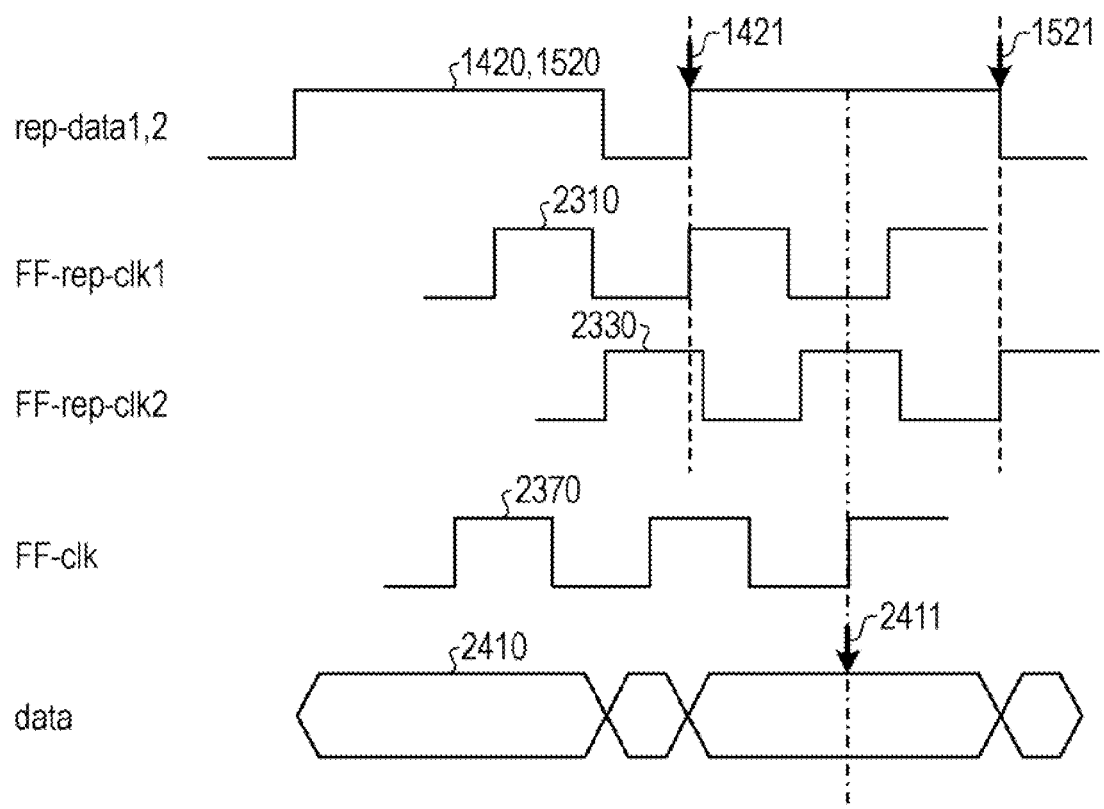
FIG. 24 is a diagram illustrating a control result of the parallel-serial converter illustrated in FIG. 22.

FIG. 24 is a diagram illustrating a control result of the parallel-serial converter 200 illustrated in FIG. 22. In FIG. 24, portions similar to those illustrated in FIG. 23 are represented by the same reference numerals and descriptions thereof are omitted. In FIG. 24, the replica data "rep-data1" and the replica data "rep-data2" are represented using a single waveform because they are synchronous.

Reference numeral 2410 represents the data "data" input to the flip-flop 240. The phase of the clock signal "FF-clk" represented by reference numeral 2370 is controlled so as to become an intermediate phase between the first switching point (represented by reference numeral 1421) of the replica data "rep-data 1" and the second switching point (represented by reference numeral 1521) of the replica data "rep-data2". Therefore, an optimum point 2411 of the data "data" (an intermediate point between the first and second switching points) may be synchronized with a rising edge of the clock signal "FF-clk". Thus, the flip-flop 240 shapes the data "data" using the optimum point 2411. The data "data" may accurately be shaped.

Figure 25:
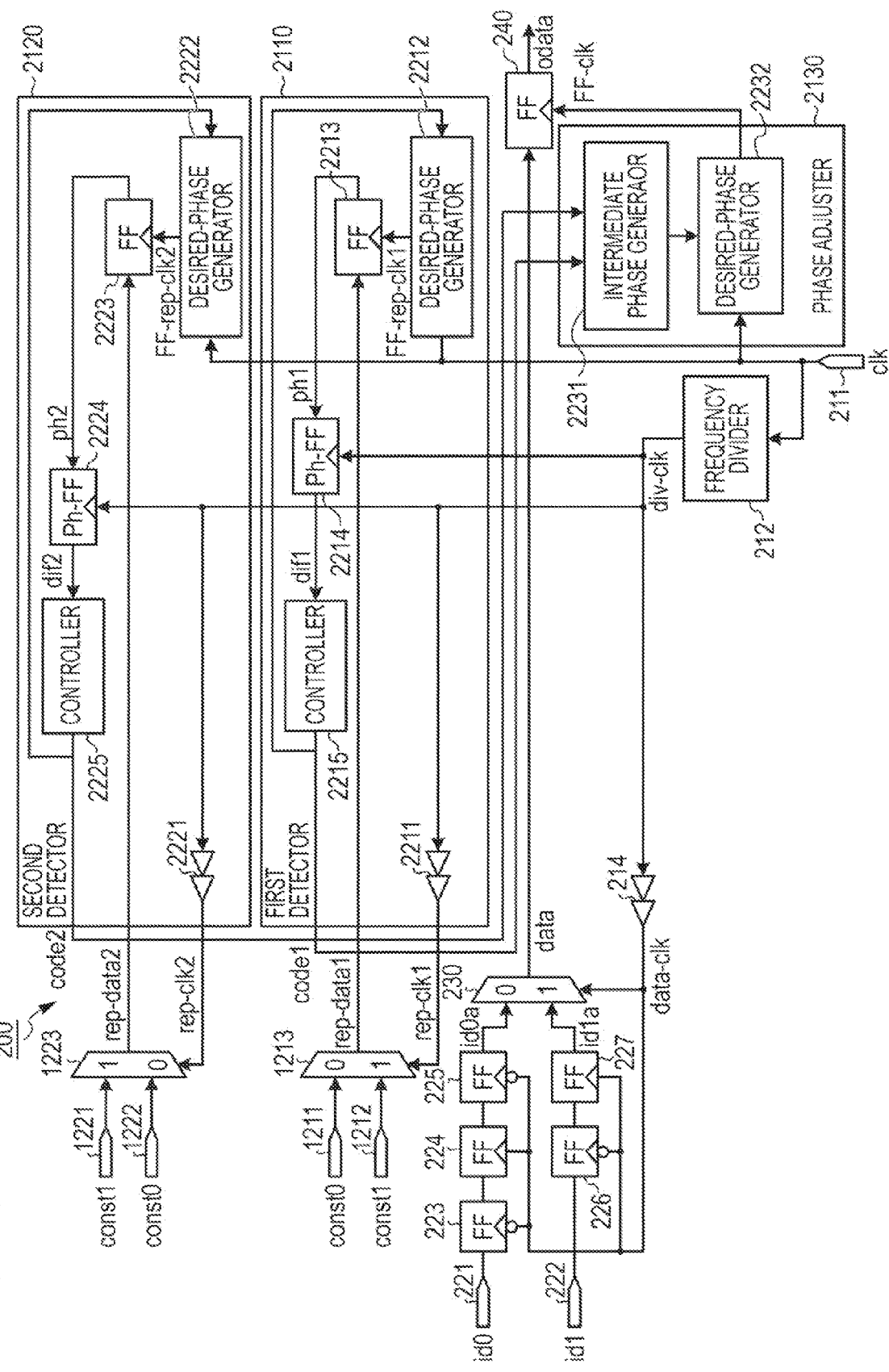
FIG. 25 is a diagram illustrating an exemplary modification of the parallel-serial converter illustrated in FIG. 22.

FIG. 25 is a diagram illustrating an exemplary modification of the parallel-serial converter 200 illustrated in FIG. 22. In FIG. 25, elements similar to those illustrated in FIG. 22 are represented by the same reference numerals and descriptions thereof are omitted. Fixed data "1" (const1) is input to the input terminal 1221. The input fixed data "1" input through the input terminal 1221 is input to the selector 1223. Fixed data "0" (const0) is input to the input terminal 1222. The input fixed data "0" input through the input terminal 1222 is input to the selector 1223.

The controller 2225 receives the output "dif2" output from the flip-flop 2224 without the output "dif2" being inverted. The output "dif2" received by the controller 2225 indicates a shift of a rising edge of the clock signal "clk" with respect to a second switching point (a switching point from "1" to "0") of the replica data "rep-data2".

As in the exemplary modification illustrated in FIG. 25, since the fixed data input to the input terminals 1221 and 1222 are inverted, even a configuration in which the controller 2225 receives the output "dif2" without the output "dif2" being inverted may achieve results equivalent to those of the configuration illustrated in FIG. 22.

In this manner, the parallel-serial converter 200 according to the fifth embodiment performs timing control based on an intermediate phase of a first switching point and a second switching point of the replica data items. Therefore, even when the duty ratio of the data "data" is not 50%, the rising time of the clock signal "FF-clk" with respect to the data "data" may be controlled as desired, and the data "data" may accurately be shaped.

According to the parallel-serial converters disclosed herein, therefore, the timing of a flip-flop is controlled with respect to the timing of switching of a selector on the basis of a first switching point and a second switching point of replica data. Therefore, even when the duty ratio is not 50%, serial data may accurately be shaped.

In the foregoing embodiments, the flip-flop 240 synchronizes a rising edge of the clock signal "clk" (or the clock signal "FF-clk") with an intermediate point between switching points of the data "data", by way of example. However, a rising edge of the clock signal "clk" may not necessarily be synchronized with an intermediate point between switching points of the data "data", and may be set as desired in accordance with the characteristics or the like of a circuit subsequent to the parallel-serial converter 100 (or 200).

In the foregoing embodiments, the parallel-serial converter configured to use electronic circuits are described, but functions realized by the electronic circuits may be realized by writing a program for a PLD (programmable logic device).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A parallel-serial converter comprising:
a selector to convert parallel data to serial data;
a flip-flop to which the serial data are input so as to latch the serial data;
a generator to generate replica data simulating the serial data;
a detector to detect a first switching point of the replica data and a second switching point subsequent to the first switching point; and
a controller to control relative timings of timing converted to the serial data in the selector and timing when the serial data is latched in the flip-flop, based on the first switching point and the second switching point,
wherein the generator switches a value of the replica data in synchronization with conversion timing of the parallel data to the serial data in the selector.

2. The parallel-serial converter according to claim 1, wherein:
the detector detects each direction of shifts of latch timings in the flip-flop with respect to the first switching point and the second switching point;
the controller controls the relative timings, based on the each direction of shifts detected in the detector.

3. The parallel-serial converter according to claim 2, wherein the controller controls the relative timings so that the shifts of latch timings become small.

4. The parallel-serial converter according to claim 3, further comprising:
a frequency divider to divide a frequency of a clock signal supplied to the flip-flop;
a replica flip-flop to synchronize the replica data generated in the generator with a falling edge of the clock signal;
a first flip-flop to synchronize an output signal of the replica flip-flop with a rising edge of a frequency-divided clock signal divided in the frequency divider; and
a second flip-flop to synchronize an output signal of the replica flip-flop with a falling edge of a frequency-divided clock signal divided in the frequency divider;
wherein the controller controls the relative timings, based on the outputs of the first flip-flop and the second flip-flop.

5. The parallel-serial converter according to claim 4, wherein the controller controls the relative timings so that a unit amount of control of the relative timings is increased as a proportion of values of the outputs of the first flip-flop and the second flip-flop that are same increases.

6. The parallel-serial converter according to claim 5, wherein:
the selector converts the parallel data to the serial data in synchronization with a clock signal supplied; and
the controller controls a phase of the clock signal supplied to the selector.

7. The parallel-serial converter according to claim 5, wherein the controller controls a phase of a clock signal supplied to the flip-flop.

8. A parallel-serial converter comprising:
a selector to convert parallel data to serial data;
a flip-flop to which the serial data are input so as to latch the serial data;
a generator to generate replica data simulating the serial data;
a detector to detect a first switching point of the replica data and a second switching point subsequent to the first switching point; and
a controller to control relative timings of timing converted to the serial data in the selector and timing when the serial data is latched in the flip-flop, based on the first switching point and the second switching point,
wherein the controller controls the relative timings, based on an intermediate phase of the first and second switching points detected in the detector.

9. The parallel-serial converter according to claim 8, wherein:
the generator generates first replica data that the first switching point synchronizes with the flip-flop and second replica data that the second switching point synchronizes with the flip-flop; and
the detector detects the first switching point of the first replica data and the second switching point of the second replica data.

10. The parallel-serial converter according to claim 9, wherein:
the selector converts the parallel data to the serial data in synchronization with a clock signal supplied; and
the generator generates the first and second replica data that have a same duty ratio as the clock signal supplied to the selector.

11. The parallel-serial converter according to claim 10, wherein:
the detector generates a first phase code indicating a phase of the first switching point and a second phase code indicating a phase of the second switching point; and
the controller controls a phase of the clock signal supplied to the selector, based on an intermediate phase of phases indicated by the first and second phase code.

12. The parallel-serial converter according to claim 8, wherein the generator switches a value of the replica data in synchronization with conversion timing of the parallel data to the serial data in the selector.

13. The parallel-serial converter according to claim 12, wherein:
the flip-flop synchronizes a timing of the serial data with a rising edge of a clock signal supplied;
the detector generates a first phase code indicating a phase of the first switching point and a second phase code indicating a phase of the second switching point; and the controller controls a phase of the clock signal supplied to the flip-flop, based on an intermediate phase of phases indicated by the first and second phase code.

14. A parallel-serial converter comprising:

a selector to convert parallel data to serial data;

a flip-flop to which the serial data are input so as to latch the serial data;

a generator to generate replica data simulating the serial data;

a detector to detect a first switching point of the replica data and a second switching point subsequent to the first switching point; and a controller to control relative timings of timing converted to the serial data in the selector and timing when the serial data is latched in the flip-flop, based on the first switching point and the second switching point, wherein a clock signal is supplied to at least one of the selector and the flip-flop, and the controller controls a phase of the clock signal supplied to the at least one of the selector and the flip-flop.

* * * * *